(12) United States Patent
Jo et al.

(10) Patent No.: US 11,758,779 B2
(45) Date of Patent: Sep. 12, 2023

(54) DISPLAY DEVICE HAVING ONE OF MULTIPLE INSULATION LAYERS OMITTED FROM AT LEAST ONE REGION OF AN EMISSION AREA

(71) Applicant: LG Display Co., Ltd., Seoul (KR)

(72) Inventors: Yongsun Jo, Paju-si (KR); WooJung Byun, Paju-si (KR); Deuksoo Jung, Paju-si (KR); Juhyuk Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 164 days.

(21) Appl. No.: 17/138,212

(22) Filed: Dec. 30, 2020

(65) Prior Publication Data
US 2021/0202674 A1 Jul. 1, 2021

(30) Foreign Application Priority Data

Dec. 31, 2019 (KR) .......................... 10-2019-0179731

(51) Int. Cl.
*H10K 59/131* (2023.01)
*H10K 50/813* (2023.01)
*H10K 50/822* (2023.01)
*H10K 50/844* (2023.01)
*H10K 59/124* (2023.01)
*H10K 71/00* (2023.01)

(52) U.S. Cl.
CPC ......... *H10K 59/131* (2023.02); *H10K 50/813* (2023.02); *H10K 50/822* (2023.02); *H10K 50/844* (2023.02); *H10K 59/124* (2023.02); *H10K 71/00* (2023.02)

(58) Field of Classification Search
CPC ............. H01L 27/3246; H01L 27/3258; H01L 27/3276; H01L 51/5209; H01L 51/5225; H01L 51/5253; H01L 51/56; H01L 2227/323; H10K 50/813; H10K 50/822; H10K 50/844; H10K 59/12; H10K 59/124; H10K 59/131; H10K 59/80515; H10K 59/80521; H10K 59/873; H10K 71/00; H10K 71/40; H10K 71/421; H10K 71/441
USPC ......................................................... 257/40
See application file for complete search history.

(56) References Cited

U.S. PATENT DOCUMENTS

2011/0310069 A1* 12/2011 Sagawa ............... H01L 27/3262
257/E33.001

FOREIGN PATENT DOCUMENTS

KR 20160040345 A * 4/2016 ......... H01L 27/3248
KR 10-2018-0016669 A 2/2018
(Continued)

*Primary Examiner* — Matthew E. Gordon
(74) *Attorney, Agent, or Firm* — POLSINELLI PC

(57) ABSTRACT

A display device includes a substrate where a pixel is placed, and including an emission area and a wire area adjacent to the emission area; at least one wire formed on the substrate in the wire area; multiple insulation layers formed on the at least one wire; an anode electrode formed on the multiple insulation layers in the emission area; an emission layer formed on the anode electrode, and covering the anode electrode; and a cathode electrode formed on the emission layer, wherein the at least one wire formed on the substrate applies a signal to the pixel, the multiple insulation layers cover the at least one wire, and at least one of the multiple insulation layers is formed in a region of the substrate except at least one region or all regions of the emission area.

18 Claims, 20 Drawing Sheets

(56) References Cited

FOREIGN PATENT DOCUMENTS

KR    10-2018-0025054 A    3/2018
KR    10-2018-0030365 A    3/2018

* cited by examiner

DISPLAY DEVICE HAVING ONE OF MULTIPLE INSULATION LAYERS OMITTED FROM AT LEAST ONE REGION OF AN EMISSION AREA

CROSS-REFERENCE TO RELATED APPLICATION

The present application claims priority to Korean Patent Application No. 10-2019-0179731, filed Dec. 31, 2019, which is hereby incorporated by reference in its entirety.

BACKGROUND

Field of the Disclosure

The present disclosure relates to a display device and a method of manufacturing the same.

Description of the Background

Organic light-emitting elements (hereinafter, referred to as light-emitting elements) constituting an organic light-emitting diode display are self-luminous and do not require a separate light source, so that the thickness and the weight of the display device are reduced. In addition, the organic light-emitting diode display has high quality characteristics, such as low power consumption, high luminance, and a high response rate.

In general, a light-emitting element has a structure in which the following are stacked: an anode electrode, a bank surrounding an edge area of the anode electrode, an emission layer formed on the anode electrode at the inside of the bank, and a cathode electrode covering the emission layer and the bank. The amount of current flowing to the light-emitting element is controlled by a driving transistor, so that the light-emitting element emits light at a required luminance.

The foregoing is intended merely to aid in the understanding of the background of the present disclosure, and is not intended to mean that the present disclosure falls within the purview of the background art that is already known to those skilled in the art.

SUMMARY

Accordingly, the present disclosure is to provide a display device having a bankless structure in which a bank of an organic light-emitting element is omitted so as to reduce a process step and manufacturing cost.

The present disclosure is also to provide a display device having a bankless structure for solving problems of over light emission at an edge area of an anode electrode and a decrease in light extraction efficiency.

According to an aspect of the present disclosure, there is provided a display device including: a substrate in which a pixel is placed, and including an emission area and a wire area adjacent to the emission area; at least one wire formed on the substrate in the wire area; multiple insulation layers formed on the at least one wire; an anode electrode formed on the multiple insulation layers in the emission area; an emission layer formed on the anode electrode, and covering the anode electrode; and a cathode electrode formed on the emission layer, wherein the at least one wire formed on the substrate applies a signal to the pixel, the multiple insulation layers cover the at least one wire, and at least one of the multiple insulation layers is formed in a region of the substrate except at least one region or all regions of the emission area.

The multiple insulation layers may include: a buffer layer covering the at least one wire; a passivation layer formed on the buffer layer; and an overcoat layer formed above the buffer layer.

The buffer layer may be formed in the region of the substrate except the at least one region or the all regions of the emission area, and the passivation layer and the overcoat layer may be formed throughout the emission area and the wire area.

The at least one region may include an edge area of the emission area, and the buffer layer may be formed in a central area of the emission area and in the wire area.

The overcoat layer may have a shape in which an upper surface of the overcoat layer is high in a region where the buffer layer is formed and the upper surface of the overcoat layer is low in a region where the buffer layer is not formed.

The anode electrode may have a shape that depends on a profile of the upper surface of the overcoat layer.

When the buffer layer is formed in the central area of the emission area and in the wire area except the edge area of the emission area, the anode electrode is formed to be convex.

When the buffer layer is formed in the wire area except the all regions of the emission area, the anode electrode is formed to be concave.

The display device may further include: a color filter placed between the passivation layer and the overcoat layer in the emission area.

The substrate may further include a non-emission area in which circuit elements for driving the pixel are formed, and the display device may further include: an active layer formed on the buffer layer in the non-emission area; a gate insulation layer formed in a pattern on the active layer; and a conductive layer formed on the gate insulation layer.

The buffer layer may be formed in a pattern in the region of the substrate except the at least one region or the all regions during a patterning process of the gate insulation layer.

The display device may further include: a light absorption layer placed on the passivation layer in the non-emission area, and including a colorant.

According to an aspect, there is provided a method of manufacturing a display device, the method including: forming at least one wire in a wire area of a substrate that includes an emission area, a non-emission area, and the wire area; forming a buffer layer covering the at least one wire; forming an active layer on the buffer layer in the emission area; forming a gate insulation layer in a pattern on the active layer; forming a conductive layer on the gate insulation layer; forming an overcoat layer above the substrate; forming an anode electrode on the overcoat layer in the emission area; forming an emission layer covering the anode electrode; and forming a cathode electrode on the emission layer, wherein the buffer layer may be etched in at least one region or all regions of the emission area by the forming of the gate insulation layer.

The at least one region may include an edge area of the emission area, and the buffer layer may be formed in a central area of the emission area and in the wire area.

The overcoat layer may have a shape in which an upper surface of the overcoat layer is high in a region where the buffer layer is formed and the upper surface of the overcoat layer is low in a region where the buffer layer is not formed.

The anode electrode may have a shape that depends on a profile of the upper surface of the overcoat layer.

The method of manufacturing the display device may further include, after the forming of the conductive layer: forming a passivation layer on the substrate; and forming a color filter on the passivation layer in the emission area.

The aspects solves the problem of over light emission at the edge area of the light-emitting element in the bankless structure, thereby increasing the lifespan of the light-emitting element and increasing light extraction efficiency.

BRIEF DESCRIPTION OF THE DRAWINGS

The above and other features and advantages of the present disclosure will be more clearly understood from the following detailed description when taken in conjunction with the accompanying drawings, in which.

DETAILED DESCRIPTION

Figure 1:
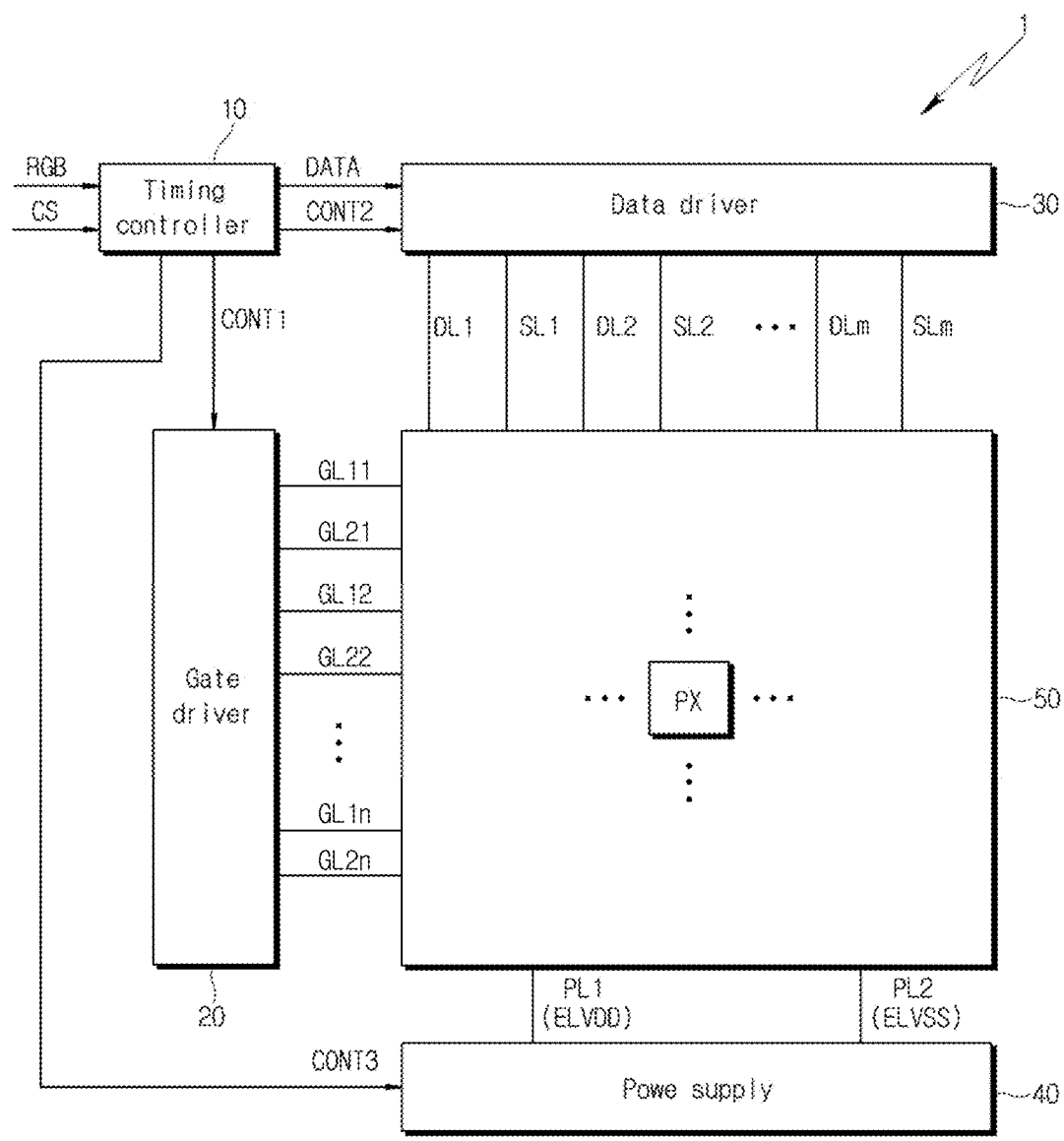
FIG. 1 is a block diagram showing a configuration of a display device according to an aspect.

Hereinafter, aspects will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/or" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the aspects, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

FIG. 1 is a block diagram showing a configuration of a display device according to an aspect of the present disclosure.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include grayscale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be connected to pixels (or subpixels) PXs of the display panel 50 through multiple first gate lines GL11 to GL1n. The gate driver 20 may generate gate signals on the basis of the gate driving control signal CONT1 output from the timing controller 10. The gate driver 20 may provide the generated gate signals to the pixels PXs through the multiple first gate lines GL11 to GL1n.

In various aspects, the gate driver 20 may be further connected to the pixels PXs of the display panel 50 through multiple second gate lines GL21 to GL2n. The gate driver 20 may provide a sensing signal to the pixels PXs through the multiple second gate lines GL21 to GL2n. The sensing signal may be supplied so as to measure a characteristic of a driving transistor and/or a light-emitting element provided inside the pixels PXs.

The data driver 30 may be connected to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm.

In various aspects, the data driver 30 may be further connected to the pixels PXs of the display panel 50 through multiple sensing lines (or reference lines) SL1 to SLm. The data driver 30 may provide a reference voltage (a sensing voltage, or an initialization voltage) to the pixels PXs through the multiple sensing lines SL1 to SLm, or may sense states of the pixels PXs on the basis of an electrical signal fed back from the pixels PXs.

The power supply 40 may be connected to the pixels PXs of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs may be, for example, arranged in a matrix form on the display panel 50.

Each of the pixels PXs may be electrically connected to the corresponding gate line and the corresponding data line. Such pixels PXs may emit light with luminance corresponding to the gate signals and the data signals that are supplied through the first gate lines GL11 to GL1n and the data lines DL1 to DLm, respectively.

Each pixel PX may display any one among a first to a third color. In an aspect, each pixel PX may display any one among red, green, and blue colors. In another aspect, each pixel PX may display any one among cyan, magenta, and yellow colors. In various aspects, the pixels PXs may be constructed to display any one among four or more colors. For example, each pixel PX may display any one among red, green, blue, and white colors.

The timing controller 10, the gate driver 20, the data driver 30, and the power supply 40 may be constructed as separate integrated circuits (ICs), or ICs in which at least some thereof are integrated. For example, at least one among the data driver 30 and the power supply 40 may be constructed as an integrated circuit integrated with the timing controller 10.

In addition, in FIG. 1, the gate driver 20 and the data driver 30 are shown as elements separate from the display panel 50, but at least one among the gate driver 20 and the data driver 30 may be constructed in an in-panel manner that is formed being integrated with the display panel 50. For example, the gate driver 20 may be formed being integrated with the display panel 50 according to a gate-in-panel (GIP) manner.

Figure 2:
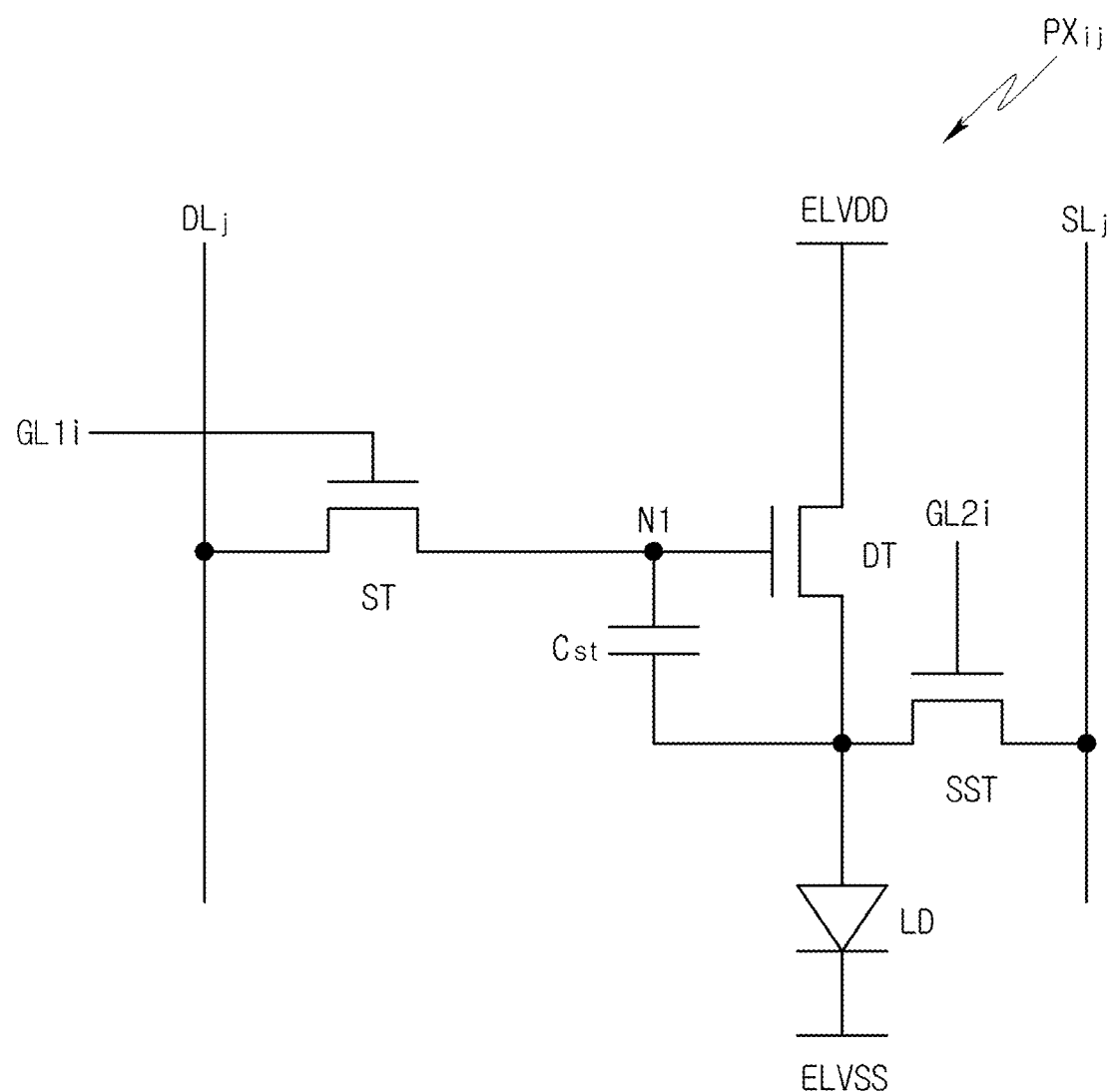
FIG. 2 is a circuit diagram showing a pixel shown in FIG. 1.

FIG. 2 is a circuit diagram showing an aspect of the pixel shown in FIG. 1. FIG. 2 shows, as an example, a pixel PXij that is connected to an i-th first gate line GL1i and a j-th data line DLj.

Referring to FIG. 2, a pixel PX includes a switching transistor ST, a driving transistor DT, a sensing transistor SST, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th first gate line GL1i. The switching transistor ST is turned on when a gate signal at a gate-on level is applied through the i-th first gate line GL1i, and transmits a data signal applied through the j-th data line DLj, to the first node N1.

A first electrode of the storage capacitor Cst is electrically connected to the first node N1, and a second electrode of the storage capacitor Cst receives a high-potential driving voltage ELVDD. The storage capacitor Cst may be charged with a voltage corresponding to the difference between a voltage applied to the first node N1 and the high-potential driving voltage ELVDD.

A first electrode (for example, a source electrode) of the driving transistor DT receives the high-potential driving voltage ELVDD, and a second electrode (for example, a drain electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage provided to the gate electrode, that is, a voltage stored in the storage capacitor Cst.

A first electrode (for example, a source electrode) of the sensing transistor SST is electrically connected to a j-th sensing line SLj, and a second electrode (for example, a drain electrode) of the sensing transistor SST is electrically connected to the first electrode (for example, the anode electrode) of the light-emitting element LD. A gate electrode of the sensing transistor SST is electrically connected to an i-th second gate line GL2i. The sensing transistor SST is turned on when a sensing signal at a gate-on level is applied through the i-th second gate line GL2i, and transmits a reference voltage applied through the j-th sensing line SLj, to the anode electrode of the light-emitting element LD.

The light-emitting element LD outputs light corresponding to the driving current. The light-emitting element LD may output light corresponding to any one among red, green, and blue colors. The light-emitting element LD may be an organic light-emitting diode (OLED) or an ultra-small inorganic light-emitting diode having a size in a micro to nanoscale range, but the present disclosure is not limited thereto. Hereinafter, aspects in which the light-emitting element LD is an organic light-emitting diode will be described.

In the present disclosure, the structure of the pixels PXs is not limited to that shown in FIG. 2. According to an aspect, the pixels PXs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST, the driving transistor, and the sensing transistor SST are NMOS transistors, but the present disclosure is not limited thereto. For example, at least some or all of the transistors constituting each pixel PX may be PMOS transistors. In various aspects, each of the switching transistor ST, the driving transistor DT, and the sensing transistor SST may be implemented as a low-temperature polycrystalline silicon (LTPS) thin-film transistor, an oxide thin-film transistor, or a low-temperature polycrystalline oxide (LTPO) thin-film transistor.

Figure 3A:
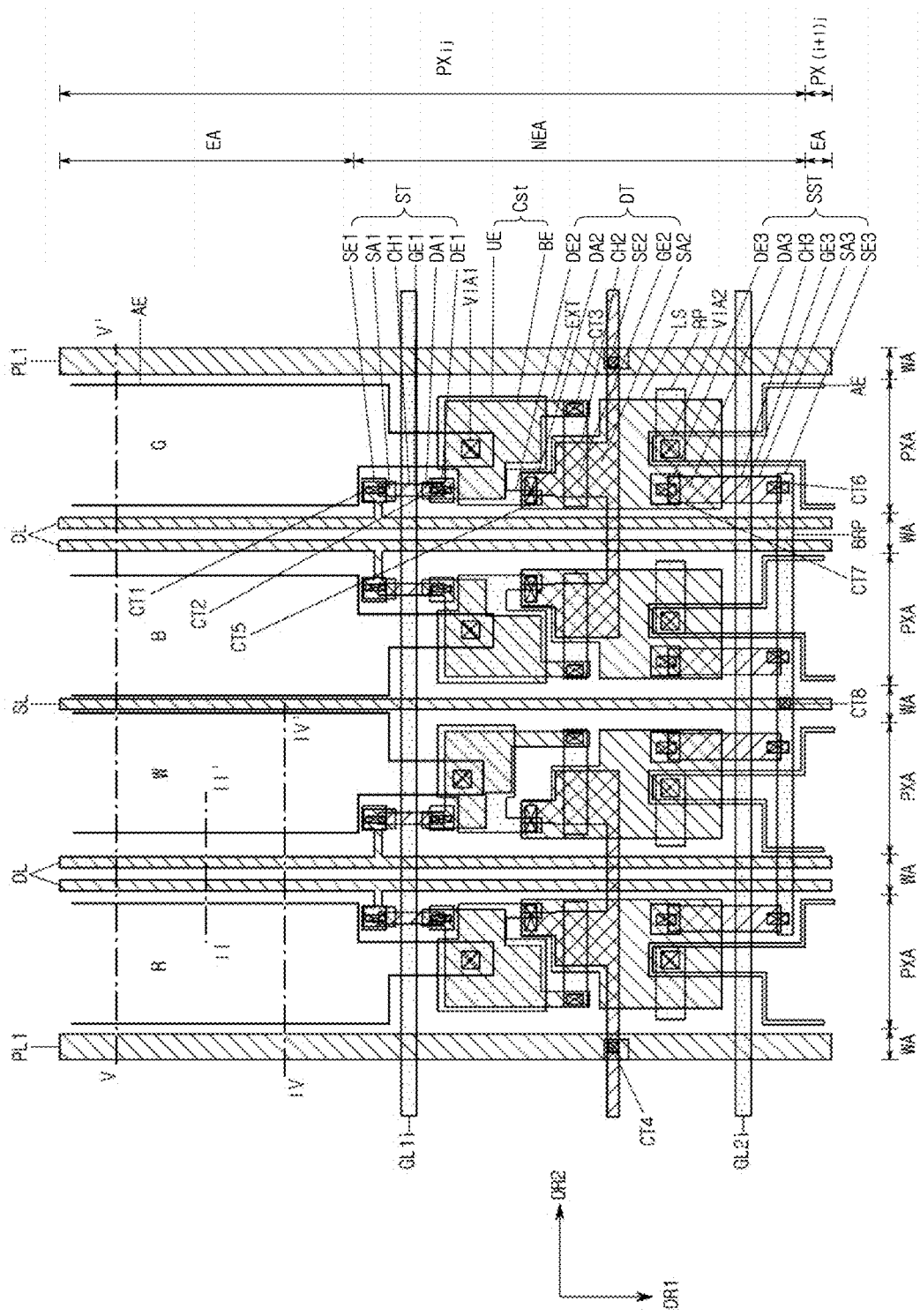
FIGS. 3A and 3B are diagrams showing a plane layout of a pixel according to an aspect of the present disclosure.
Figure 3B:
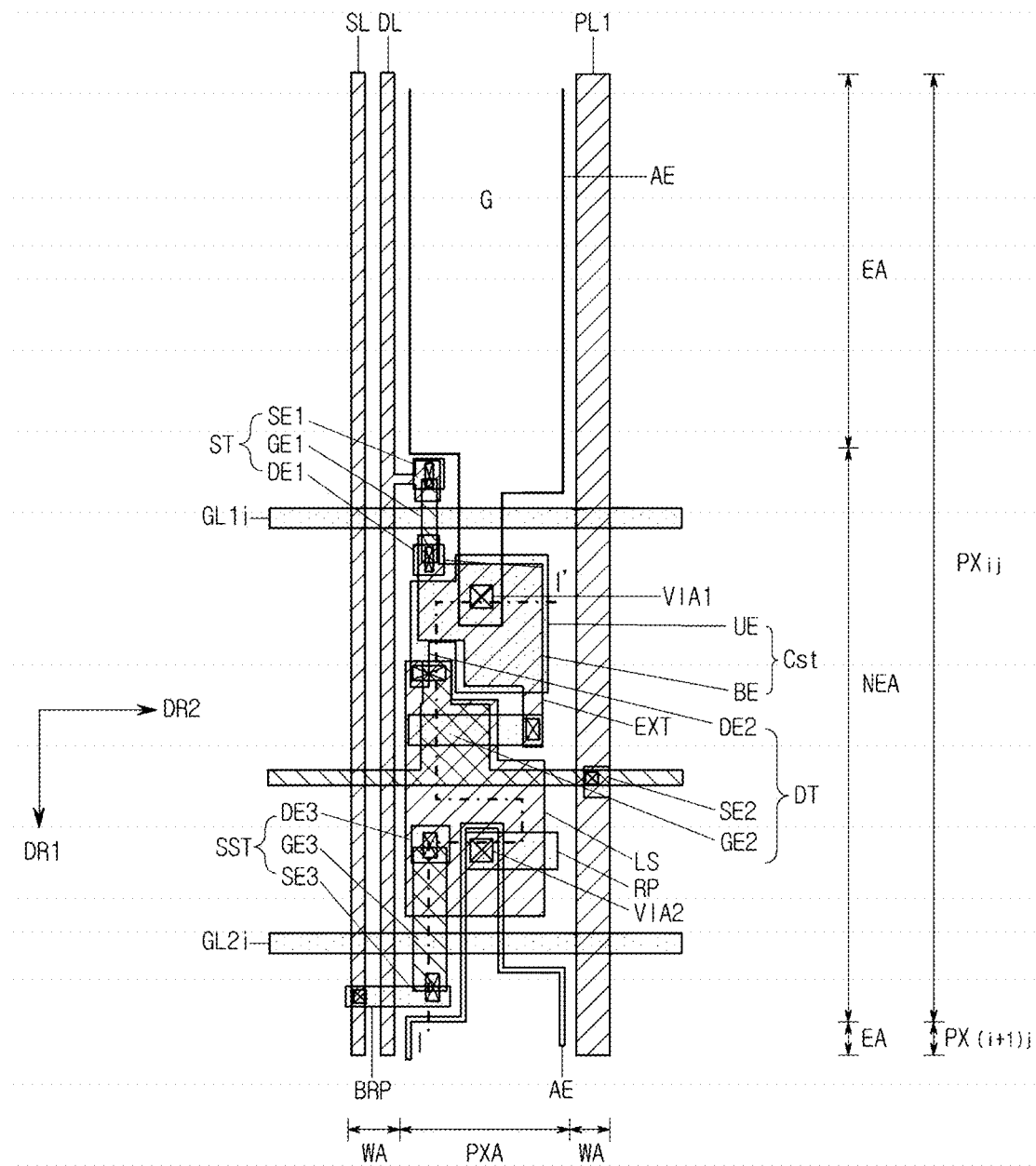

FIGS. 3A and 3B are diagrams showing a plane layout of a pixel according to an aspect.

Referring to FIGS. 2, 3A and 3B together, the display panel 50 includes pixel areas PXAs defined at intersection regions of the data lines DLs, which extend in a first direction (for example, a pixel column direction DR1), and the first and the second gate lines GL1s and GL2s, which extend in a second direction (for example, a pixel row direction DR2). The pixels PXs are arranged in the respective pixel areas PXAs.

Each of the pixel areas PXA may include an emission area EA, and a non-emission area NEA. In the emission area EA, the light-emitting element LD of the pixel PX is placed. In the non-emission area NEA, circuit elements (for example, a switching transistor ST, a driving transistor DT, a sensing transistor SST, and a storage capacitor Cst) for driving the light-emitting element LD are placed. The light-emitting element LD is driven by the circuit elements placed in the non-emission area NEA and emits light in a particular color.

Wire areas WAs may be defined between pixel columns. In each of the wire areas WAs, the data line DL and the sensing line SL that extend in the first direction DR1 are placed. The data line DL may receive a data signal from the data driver 30. The sensing line SL may receive a reference voltage from the data driver 30, or may transmit an electrical signal output from the corresponding pixel PX, to the data driver 30.

In an aspect, in some of the wire areas WAs, a first power line PL1 for applying the high-potential driving voltage ELVDD to the pixels PXs may be further formed. The first power line PL1 may extend in the first direction DR1 substantially parallel to the data line DL and the sensing line SL.

The first gate line GL1 and the second gate line GL2 extend in the second direction DR2, across the non-emission area NEA. Herein, the first gate line GL1 and the second gate line GL2 may be arranged at regular intervals along the first direction DR1.

The data line DL, the sensing line SL, the first power line PL1, the first gate line GL1, and the second gate line GL2 are electrically connected to the circuit elements through a contact hole. Specifically, the data line DL may be electrically connected to an electrode (for example, a source electrode) of the switching transistor ST, and the sensing line SL may be electrically connected to an electrode (for example, a source electrode) of the sensing transistor SST. The first gate line GL1 is electrically connected to gate electrodes of the switching transistor ST, and the second gate line GL2 is electrically connected to the gate electrode of the sensing transistor SST.

As described above with reference to FIG. 2, the pixel PX may include the switching transistor ST, the driving transistor DT, the sensing transistor SST, the storage capacitor Cst, and the light-emitting element LD.

The switching transistor ST may include a first gate electrode GE1, a first source electrode SE1, and a first drain electrode DE1.

The first gate electrode GE1 may be placed overlapping a first channel CH1 formed in an active layer ACT. The first channel CH1 may be a semiconductor pattern to which impurities are not doped within the active layer ACT. The first gate electrode GE1 may be electrically connected to the first gate line GL1. For example, the first gate electrode GE1 may be a region overlapping the first channel CH1 on the first gate line GL1.

The first source electrode SE1 may be connected to a first source area SA1 formed on a first side of the first channel CH1 in the active layer ACT. The first source electrode SE1 may be further connected to the data line DL through a first contact hole CT1.

The first drain electrode DE1 may be connected to a first drain area DA1 formed on a second side of the first channel CH1 in the active layer ACT. The first drain electrode DE1 may be electrically connected to a lower electrode BE of the storage capacitor Cst through a second contact hole CT2.

The driving transistor DT may include a second gate electrode GE2, a second source electrode SE2, and a second drain electrode DE2.

The second gate electrode GE2 may be placed overlapping a second channel CH2 formed in the active layer ACT. The second gate electrode GE2 may be electrically connected to the lower electrode BE of the storage capacitor Cst through a third contact hole CT3.

The second source electrode SE2 may be connected to a second source area SA2 formed on a first side of the second channel CH2 in the active layer ACT. The second source electrode SE2 may be electrically connected, through a fourth contact hole CT4, to the first power line PL1 through which the high-potential driving voltage ELVDD is applied. In this aspect, the second source electrode SE2 may be substantially constructed as a conductive pattern provided in the wire area WA.

The second drain electrode DE2 may be connected to a second drain area DA2 formed on a second side of the second channel CH2 in the active layer ACT. The second drain electrode DE2 may be electrically connected to an upper electrode UE of the storage capacitor Cst. For example, the second drain electrode DE2 may be formed being integrated with the upper electrode UE of the storage capacitor Cst, and may thus form one pattern. As described later, the upper electrode UE of the storage capacitor Cst is connected to an anode electrode AE of the light-emitting element LD through a first via hole VIA1. Therefore, passing through the upper electrode UE of the storage capacitor Cs, the second drain electrode DE2 of the driving transistor DT is electrically connected to the anode electrode AE of the light-emitting element LD.

In addition, the second drain electrode DE2 may be connected to a light-shielding layer LS through a fifth contact hole CT5. Because of this, when a defect in a pixel PX is repaired by using a repair pattern RP, which will be described later, the repair pattern RP and the light-shielding layer LS are connected through laser welding, and thus an anode electrode AE of a nearby pixel PX(i+1)j and the second drain electrode DE2 of the driving transistor DT are electrically connected.

The sensing transistor SST may include a third gate electrode GE3, a third source electrode SE3, and a third drain electrode DE3.

The third gate electrode GE3 may be placed overlapping a third channel CH3 formed in the active layer ACT. The third gate electrode GE3 may be electrically connected to the second gate line GL2. For example, the third gate electrode GE3 may be a region overlapping the third channel CH3 on the second gate line GL2.

The third source electrode SE3 may be connected to a third source area SA3 formed on a first side of the third channel CH3 in the active layer ACT. The third source electrode SE3 may be electrically connected to a bridge pattern BRP through a sixth contact hole CT6. The bridge pattern BRP is electrically connected to the sensing line SL through an eighth contact hole CTB. Therefore, passing through the bridge pattern BRP, the third source electrode SE3 may be electrically connected to the sensing line SL.

The third drain electrode DE3 may be connected to a third drain area DA3 formed on a second side of the third channel CH3 in the active layer ACT. In addition, the third drain electrode DE3 may be connected to the light-shielding layer LS through a seventh contact hole CT7. In this aspect, the light-shielding layer LS is connected to the second drain electrode DE2 of the driving transistor DT through the fifth contact hole CT5. Therefore, passing through the light-shielding layer LS, the third drain electrode DE3 is electrically connected to the second drain electrode DE2 of the driving transistor DT.

The storage capacitor Cst may include the lower electrode BE and the upper electrode UE.

The lower electrode BE may be electrically connected to the first drain electrode DE1 of the switching transistor ST through the second contact hole CT2. In addition, the lower electrode BE may be electrically connected to the second gate electrode GE2 of the driving transistor DT through the third contact hole CT3.

In an aspect, the lower electrode BE may include an extended part EXT for connection to the second gate electrode GE2 of the driving transistor DT. In a region of the extended part EXT, the lower electrode BE is overlapped by the second gate electrode GE2, and is electrically connected to the second gate electrode GE2 through the third contact hole CT3. The other region of the extended part EXT is placed not to be overlapped by a second conductive layer, which will be described later, and by the anode electrode AE of the light-emitting element LD. Because of this, when the second gate electrode GE2 and the anode electrode AE are electrically separated by cutting the extended part EXT with a laser beam and a defect in a pixel PX is repaired, an electrical short circuit between conductive layers and/or between the anode electrode AE and the cathode electrode CE of the light-emitting element LD is prevented.

The upper electrode UE is formed in such a manner that at least a region thereof covers the lower electrode BE. Between the upper electrode UE and the lower electrode BE, electric charges corresponding to the potential difference between the two electrodes are stored, so that the upper electrode UE and the lower electrode BE may operate as a storage capacitor Cst.

An area where the upper electrode UE and the lower electrode BE overlap may determine the capacitance of the storage capacitor Cst. Therefore, the upper electrode UE and the lower electrode BE may have an area (size) for satisfying the required capacitance of the storage capacitor Cst.

In an aspect, in the case where a pixel PX emits light in a white color, it is important to secure an opening area of the pixel PX rather than the capacitance of the storage capacitor Cst. In this aspect, the area of the upper electrode UE and the lower electrode BE of the pixel PX that emits light in a white color may be set smaller than that of a pixel emitting light in another color. Accordingly, the size of the opening area between the storage capacitor Cst and the driving transistor DT may be increased. In the case where the anode electrode AE of the light-emitting element LD extends to the opening areas of the non-emission area NEA, light generated by the light-emitting element LD is emitted to the outside through the extended opening area.

The upper electrode UE may be electrically connected to the second drain electrode DE2 of the driving transistor DT through the fifth contact hole CT5. In addition, the upper electrode UE may be electrically connected to the anode electrode AE of the light-emitting element LD through the first via hole VIA1.

The storage capacitor Cst as described above is connected to the second gate electrode GE2 of the driving transistor DT through the lower electrode BE. Above the driving transistor DT, the cathode electrode CE of the light-emitting element LD, which will be described later, may be formed. Herein, an electric field may be formed between the second gate electrode GE2 of the driving transistor DT and the cathode electrode CE, which may lower the charging rate of the storage capacitor Cst electrically connected to the second gate electrode GE2. In other words, a parasitic capacitor that has the second gate electrode GE2 as a first electrode and the cathode electrode CE as a second electrode may be formed. As in this aspect, in the case where the second gate electrode GE2 is electrically connected to the lower electrode BE rather than the upper electrode UE of the storage capacitor Cst, an electrical path from the parasitic capacitor to the storage capacitor Cst is relatively longer, and thus the influence of the parasitic capacitor may be reduced. In addition, because the lower electrode BE of the storage capacitor Cst is formed on the substrate of the display panel 50, the formation of the electric field between the second gate electrode GE2 and the cathode electrode CE is prevented, thereby removing the parasitic capacitor.

The light-emitting element LD may include the anode electrode AE, the cathode electrode CE, and an emission layer EML placed between the anode electrode AE and the cathode electrode CE. In an aspect, the anode electrode AE, the emission layer EML, and the cathode electrode CE may be placed in such a manner as to overlap each other in the emission area EA.

The anode electrode AE may be connected to the upper electrode UE of the storage capacitor Cst through the first via hole VIA1 On the anode electrode AE, the emission layer EML and the cathode electrode CE may be placed. Generally, the anode electrode AE is formed in the emission area EA. However, in order to be in contact with the upper electrode UE of the storage capacitor Cst, at least a region of the anode electrode AE may extend to the non-emission area NEA.

In an aspect, in the case where the pixel PX displays a white color, the anode electrode AE may extend widely to the non-emission area NEA. Herein, light generated from the light-emitting element LD implemented as a bottom emission type may be emitted to the outside through the opening areas between the circuit elements placed in the non-emission area NEA.

The emission layer EML and the cathode electrode CE are formed to be wide in the emission area EA and the non-emission area NEA. Herein, the cathode electrode CE directly covers the anode electrode AE.

In an aspect, the pixel PX may further include the repair pattern RP. The repair pattern RP is placed in such a manner that a region thereof is not overlapped by the anode electrode AE of the nearby pixel PX(i+1)j, but overlaps the light-shielding layer LS.

Herein, a region of the repair pattern RP except the above-described region is electrically connected to the anode electrode AE of the nearby pixel PX(i+1)j through the second via hole VIA2. In order to be electrically connected to the anode electrode AE of the nearby pixel PX(i+1)j, the repair pattern RP may be placed near the anode electrode AE of the nearby pixel PX(i+1)j within the non-emission area NEA.

Since the repair pattern RP is placed near the anode electrode AE of the nearby pixel PX(i+1)j within the non-emission area NEA, the light-shielding layer LS which is placed being overlapped by the region of the repair pattern RP may have an area that widely extends from a portion overlapped by the driving transistor DT to the region.

Generally, the repair pattern RP as described above may be an island-shaped electrode that has a shape of a bar extending along the second direction DR2. However, the shape of the repair pattern RP is not limited thereto, and may be variously modified depending on a relative arrangement state of other elements including the light-shielding layer LS and the anode electrode AE.

FIGS. 3A and 3B show, as an example, a display device 1 having a WRGB structure including a white pixel W. However, the above-described aspects are not applied only to the display device 1 having the WRGB structure. That is, among the above-described aspects, various features not related to a white pixel W may be applied to display devices having an RGB structure or RGBG structure that do not include a white pixel W. In addition, among the above-described aspects, various features related to a white pixel W may be applied to the display device 1 having the WRGB structure as well as display devices having various structures that include a white pixel W.

Hereinafter, a stacked structure (sectional structure) of the pixel PX according to an aspect will be described in more detail with reference to the drawings.

Figure 4:
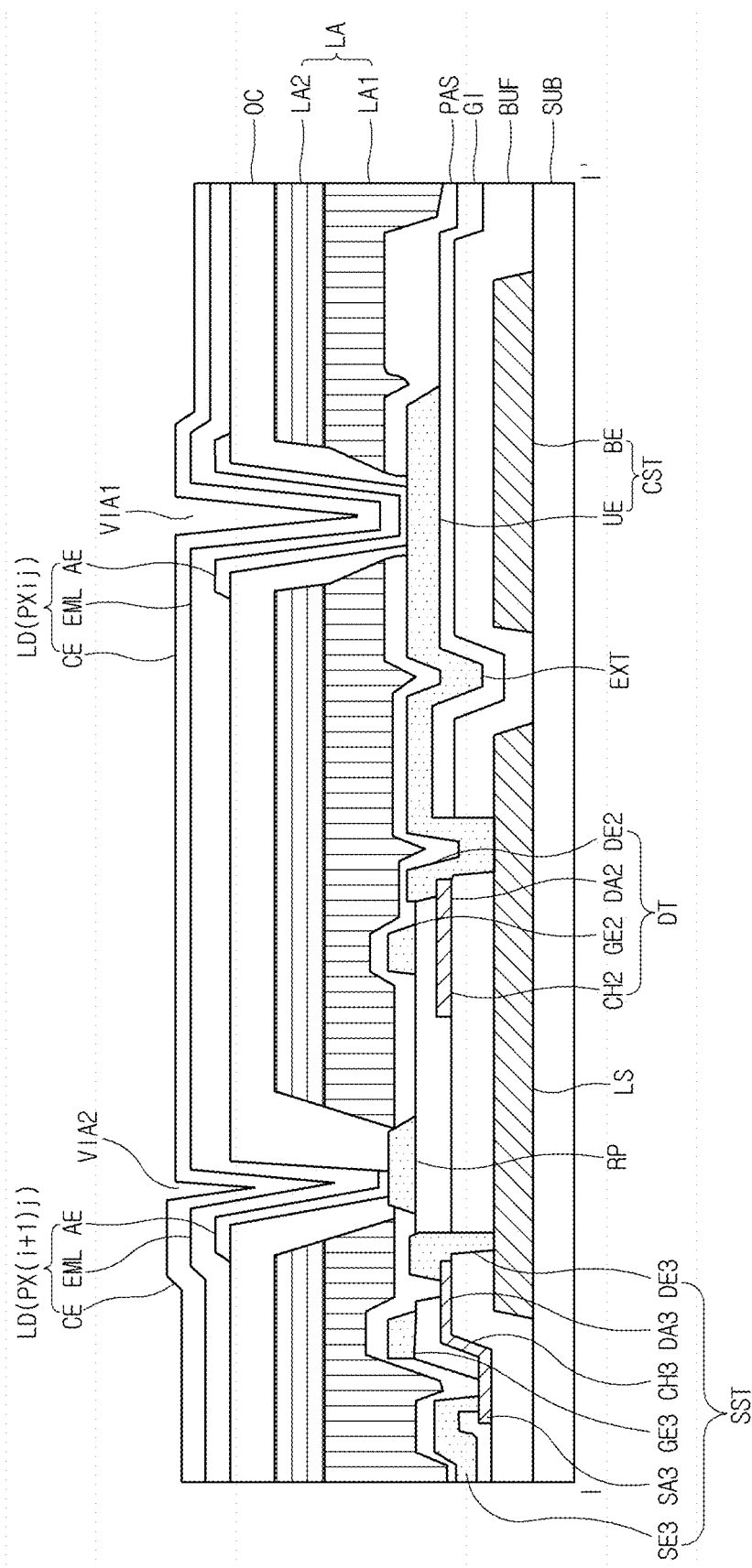
FIG. 4 is a cross-sectional view of a pixel according to an aspect of the present disclosure.

FIG. 4 is a cross-sectional view of a pixel according to an aspect. Specifically, FIG. 4 is a cross-sectional view taken along line I-I' of FIG. 3B.

Referring to FIGS. 3A and 3B, and 4 together, the display panel 50 may include a substrate SUB, a circuit element layer, and a light-emitting element layer.

The substrate SUB is a base member of the display panel 50, and may be a light-transmissive substrate. The substrate SUB may be a rigid substrate including glass or tempered glass, or may be a flexible substrate made of a plastic material. For example, the substrate SUB may be made of a plastic material, such as polyimide, polyethylene terephthalate (PET), polyethylene naphthalate (PEN), polycarbonate (PC), and the like. However, the material of the substrate SUB is not limited thereto.

On the substrate SUB, a pixel area PXA is defined. The pixel area PXA may be defined as an area including at least one circuit element placed at the circuit element layer, and a light-emitting element LD placed at the light-emitting element layer. The at least one circuit element and the light-emitting element LD may constitute one pixel PX.

The circuit element layer is formed on the substrate SUB, and may include circuit elements (for example, a switching transistor ST, a driving transistor DT, a sensing transistor SST, a storage capacitor Cst, and the like) and wires constituting the pixel PX.

First, on the substrate SUB, a first conductive layer may be placed. The first conductive layer may include the light-shielding layer LS and the lower electrode BE of the storage capacitor Cst.

The light-shielding layer LS is placed in such a manner as to be overlapped by a semiconductor pattern of the driving transistor DT, particularly, the second channel CH2 when viewed from above, and may thus protect the oxide semiconductor device from external light. In an aspect, the light-shielding layer LS may be further connected to the second drain electrode DE2 of the driving transistor DT through the fifth contact hole CT5. Because of this, when the defect in the pixel PX is repaired by using the repair pattern RP, which will be described later, the repair pattern RP and the light-shielding layer LS are connected through laser welding, and thus the anode electrode AE of the nearby pixel PX(i+1)j and the second drain electrode DE2 of the driving transistor DT are electrically connected.

The lower electrode BE may be electrically connected to the first drain electrode DE1 of the switching transistor ST through the second contact hole CT2. In addition, the lower electrode BE may be electrically connected to the second gate electrode GE2 of the driving transistor DT through the third contact hole CT3.

In an aspect, the lower electrode BE may include an extended part EXT for connection to the second gate electrode GE2 of the driving transistor DT. In a region of the extended part EXT, the lower electrode BE is overlapped by the second gate electrode GE2, and is electrically connected to the second gate electrode GE2 through the third contact hole CT3. The other region of the extended part EXT is placed not to be overlapped by the other electrodes of the circuit elements and the anode electrode AE of the light-emitting element LD. Because of this, when the second gate electrode GE2 and the anode electrode AE are electrically separated by cutting the extended part EXT with a laser and the defect in the pixel PX is repaired, an electrical short circuit between the other electrodes and/or between the anode electrode AE and the cathode electrode CE of the light-emitting element LD is prevented.

In the wire area WA, the first conductive layer may further include the data line DL, the sensing line SL, and the first power line PL1. The data line DLj is connected to the first source electrode SE1 of the switching transistor ST through the first contact hole CT1. Passing through the bridge pattern BRP, the sensing line SL is connected to the third source electrode SE3 of the sensing transistor SST. The first power line PL1 is connected to the second source electrode SE2 of the driving transistor DT through the fourth contact hole CT4.

In various aspects, on the substrate SUB, wires and/or electrodes not shown, for example, the second power line PL2 through which the low-potential driving voltage ELVSS is applied, an auxiliary electrode, and the like may be further provided.

A buffer layer BUF is placed on the substrate SUB so as to cover the light-shielding layer LS, the lower electrode BE of the storage capacitor Cst, and the wires. The buffer layer BUF may prevent diffusion of ions or impurities from the substrate SUB, and may block moisture penetration. In addition, the buffer layer BUF may enhance the flatness of the surface of the substrate SUB. The buffer layer BUF may include an inorganic material, such as an oxide, a nitride, and the like, an organic material, or an organic-inorganic compound. The buffer layer BUF may be formed in a single-layer or multi-layer structure. For example, the buffer layer BUF may have a structure of three or more layers of silicon oxide, silicon nitride, and silicon oxide in that order. In another aspect, the buffer layer BUF may be omitted.

The active layer ACT may be formed on the buffer layer BUF. The active layer ACT may be made of a silicon-based semiconductor material or an oxide-based semiconductor material. As the silicon-based semiconductor material, amorphous silicon or polycrystalline silicon may be used. As the oxide-based semiconductor material, a quaternary metal oxide, such as an indium tin gallium zinc oxide (InSnGaZnO); a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), or a tin aluminum zinc oxide (SnAlZnO); or a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), an indium oxide (InO), a tin oxide (SnO), or a zinc oxide (ZnO), may be used.

The active layer ACT may include: the first to the third source area SA1 to SA3 and the first to the third drain area DA1 to DA3 containing p-type or n-type impurities; and the first to the third channel CH1 to CH3 formed between the first to the third source area SA1 to SA3 and the first to the third drain area DA1 to DA3, respectively.

The second conductive layer is placed on the active layer ACT. Between the active layer ACT and the second conductive layer, a gate insulation layer GI may be interposed. The gate insulation layer GI may be a silicon oxide (SiOx), a silicon nitride (SiNx), or multiple layers of a silicon oxide (SiOx) and a silicon nitride (SiNx).

The second conductive layer may include the gate electrodes GE1, GE2, and GE3, the source electrodes SE1, SE2, and SE3, and the drain electrodes DE1, DE2, and DE3. The gate electrodes GE1, GE2, and GE3 may be placed overlapping the corresponding channels CH1, CH2, and CH3 in the active layer ACT, respectively. At least some gate electrodes GE1 and GE3 among the gate electrodes GE1, GE2, and GE3 are formed being integrated with the wires GL1 and GL2 electrically connected to the gate electrodes GE1 and GE3, thereby forming one pattern.

The second conductive layer may further include the upper electrode UE of the storage capacitor Cst. The upper electrode UE is formed in such a manner that at least a region thereof covers the lower electrode BE. Between the upper electrode UE and the lower electrode BE, electric charges corresponding to the potential difference between the two electrodes are stored, so that the upper electrode UE and the lower electrode BE may operate as a storage capacitor Cst.

The upper electrode UE may be electrically connected to the second drain electrode DE2 of the driving transistor DT through the fifth contact hole CT5. In addition, the upper electrode UE may be electrically connected to the anode electrode AE of the light-emitting element LD through the first via hole VIA1.

The storage capacitor Cst as described above is connected to the second gate electrode GE2 of the driving transistor DT through the lower electrode BE. Above the driving transistor DT, the cathode electrode CE of the light-emitting element LD, which will be described later, may be formed. Herein, an electric field may be formed between the second gate electrode GE2 of the driving transistor DT and the cathode electrode CE, which may lower the charging rate of the storage capacitor Cst electrically connected to the second gate electrode GE2. In other words, a parasitic capacitor that has the second gate electrode GE2 as a first electrode and the cathode electrode CE as a second electrode may be formed. As in this aspect, in the case where the second gate electrode GE2 is electrically connected to the lower electrode BE rather than the upper electrode UE of the storage capacitor Cst, an electrical path from the parasitic capacitor to the storage capacitor Cst is relatively longer, and thus the influence of the parasitic capacitor may be reduced. In addition, because the lower electrode BE of the storage capacitor Cst is formed on the substrate of the display panel 50, the formation of the electric field between the second gate electrode GE2 and the cathode electrode CE is prevented, thereby removing the parasitic capacitor.

The second conductive layer may further include the bridge pattern BRP. The bridge pattern BRP may electrically connect the third source electrode SE3 of the sensing transistor SST and the sensing line SL.

The second conductive layer may further include the repair pattern RP. The repair pattern RP is placed in such a manner that a region thereof is not overlapped by the anode electrode AE of the nearby pixel PX(i+1)j, but overlaps the light-shielding layer LS. Herein, a region of the repair pattern RP except the above-described region is electrically connected to the anode electrode AE of the nearby pixel PX(i+1)j through the second via hole VIA2.

The first and the second conductive layer may be made of any one or an alloy of two or more selected from a group consisting of molybdenum (Mo), aluminum (Al), chromium (Cr), gold (Au), titanium (Ti), nickel (Ni), neodymium (Nd), and copper (Cu). In addition, the first and the second conductive layer may be multiple layers composed of any one or an alloy of two or more selected from a group consisting of molybdenum (Mo), aluminum (Al), chromium (Cr), gold (Au), titanium (Ti), nickel (Ni), neodymium (Nd), and copper (Cu). For example, the first and the second conductive layer may be two layers of molybdenum and aluminum-neodymium, or molybdenum and aluminum.

The circuit element layer may be covered by a passivation layer PAS. The passivation layer PAS may cover the second conductive layer, and exposed areas of the buffer layer BUF and the active layer ACT that are not covered by the second conductive layer. The passivation layer PAS may be an insulation film for protecting the lower elements, and may be a silicon oxide film (SiOx), a silicon nitride film (SiNx), or multiple layers of a silicon oxide film (SiOx) and a silicon nitride film (SiNx). In various aspects, the passivation layer PAS may be omitted.

On the passivation layer PAS, an overcoat layer OC may be formed. The overcoat layer OC may be a planarizing film for reducing the difference in level of the lower structure, and may be composed of an organic material such as polyimide, benzocyclobutene series resin, acrylate, and the like.

In an aspect of the present disclosure, between the passivation layer PAS and the overcoat layer OC, a color filter (not shown) may be formed. The color filter may be formed in the emission area EA. The color filter is a wavelength-selective optical filter that selectively transmits only a partial wavelength band of incident light by transmitting light in a particular wavelength band and blocking light in other particular wavelength bands. The color filter may be made of a photosensitive resin containing a colorant, such as a pigment, a dye, or the like. In the emission area EA, light passing through the color filter may have any one among red, green, and blue colors. In the case where a pixel PX displays a white color, the color filter may be omitted for the pixel PX.

It has been described above that the color filter is formed between the passivation layer PAS and the overcoat layer OC, but this aspect is not limited thereto. That is, in the case where the light-emitting element LD is of a top emission type, the color filter may be formed at an upper layer of a light-emitting element layer which will be described later.

The light-emitting element layer is formed on the overcoat layer OC and includes light-emitting elements LDs. The light-emitting element LD may include the anode electrode AE, the emission layer EML, and the cathode electrode CE.

At least one among the anode electrode AE and the cathode electrode CE may be a transmissive electrode and at least another may be a reflective electrode. For example, in the case where the light-emitting element LD is of a bottom emission type, the anode electrode AE may be a transmissive electrode, and the cathode electrode CE may be a reflective electrode. In contrast, in the case where the light-emitting element LD is of a top emission type, the anode electrode AE may be a reflective electrode, and the cathode electrode CE may be a transmissive electrode. In another example, in the case where the light-emitting element LD is of a dual emission type, both the anode electrode AE and the cathode electrode CE may be transmissive electrodes. Hereinafter, taking the case where the light-emitting element LD is of a bottom emission type as an example, a detailed configuration of the light-emitting element LD will be described.

The anode electrode AE is formed on the overcoat layer OC. The anode electrode AE is electrically connected to the upper electrode UE of the storage capacitor Cst through the first via hole VIA1 penetrating through the overcoat layer OC and the passivation layer PAS. Passing through the storage capacitor Cst, the anode electrode AE may be electrically connected to the second drain electrode DE2 of the driving transistor DT. As described above, when the first via hole VIA1 is formed to be in contact with the upper electrode UE of the storage capacitor Cst that has a relatively large area than other electrodes have, influence of the difference in level around the first via hole VIA1 is reduced.

The anode electrode AE may be made of a transparent conductive material, such as indium tin oxide (ITO), indium zinc oxide (IZO), zinc oxide (ZnO), or the like. In the case where the anode electrode AE is a reflective electrode, the anode electrode AE may include a reflective layer. The reflective layer may be made of aluminum (Al), copper (Cu), silver (Ag), nickel (Ni), or an alloy thereof. In an aspect, the reflective layer may be composed of an alloy (APC) of silver, palladium, and copper.

The emission layer EML is formed on the anode electrode AE. In this aspects, the display device 1 has a bankless form. In this aspect, the emission layer EML is formed in such a manner as to directly cover the anode electrode AE. The emission layer EML may be formed to be wide in the emission area EA and the non-emission area NEA.

The emission layer EML may have a multi-layer thin-film structure including a light generation layer. Herein, the color of light generated by the light generation layer may be white, red, blue, green, or the like, but is not limited thereto.

The light generation layer may include, for example, a hole transport layer HTL, an organic emission layer, and an electron transport layer ETL. The hole transport layer smoothly transports holes injected from the anode electrode AE, to the organic emission layer. The organic emission layer may be made of an organic material including a phosphorescent or fluorescent material. The electron transport layer smoothly transports electrons injected from the cathode electrode CE, to the organic emission layer. In addition to the hole transport layer, the organic emission layer, and the electron transport layer, the emission layer EML may further include a hole injection layer HIL, a hole blocking layer HBL, an electron injection layer EIL, and an electron blocking layer EBL.

The emission layer EML may be formed in a tandem structure of two or more stacks. In this case, each of the stacks may include the hole transport layer, the organic emission layer, and the electron transport layer. In the case where the emission layer EML is formed in the tandem structure of two or more stacks, a charge generation layer is formed between the stacks. The charge generation layer may include an n-type charge generation layer and a p-type charge generation layer. The n-type charge generation layer is positioned near the lower stack. The p-type charge generation layer is formed on the n-type charge generation layer and is thus positioned near the upper stack. The n-type charge generation layer injects electrons into the lower stack, and the p-type charge generation layer injects holes into the upper stack. The n-type charge generation layer may be an organic layer obtained by doping, into an organic host material having electron transport capability, alkali metals, such as lithium (Li), sodium (Na), potassium (K), or cesium (Cs), or alkaline earth metals, such as magnesium (Mg), strontium (Sr), barium (Ba), or radium (Ra). The p-type charge generation layer may be an organic layer obtained by doping dopants into an organic host material having hole transport capability.

The cathode electrode CE is formed on the emission layer EML. The cathode electrode CE may be formed to be wide in the emission area EA and the non-emission area NEA.

The cathode electrode CE may be made of a transparent conductive material (TCO) capable of transmitting light, or a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof. In the case where the cathode electrode CE is made of the semi-transmissive conductive material, light emission efficiency may be increased due to a micro cavity.

Referring to FIGS. 3A, 3B, and 4 together, in this aspect, at least a region of the anode electrode AE extends to the non-emission area NEA in order to be in contact with the circuit element. Since the emission layer EML and the cathode electrode CE are stacked on the whole area of the anode electrode AE, undesired light emission may occur in the non-emission area NEA (a light leakage phenomenon). In the non-emission area NEA, to prevent the light generated by the light-emitting element LD from being emitted to the outside, in this aspect, a light absorption layer LA formed between the passivation layer PAS and the overcoat layer OC, and in the non-emission area NEA is further included.

The light absorption layer LA may contain a colorant, such as a pigment, a dye, or the like, which selectively transmits only a partial wavelength band of incident light by transmitting light in a particular wavelength band and blocking light in other particular wavelength bands. The light absorption layer LA may have a structure in which at least two pigment layers are stacked, so as to absorb light generated by the light-emitting element LD. For example, the light absorption layer LA may include: a first absorption layer containing a pigment in a first color; and a second absorption layer containing a pigment in a second color that is different from the first color. In an aspect, the first color may be a red color and the second color may be a blue color, but no limitation thereto is imposed. As described above, in the case where absorption layers containing pigments in different colors overlap, the light leakage phenomenon is effectively blocked by a reflective luminous effect (for example, a black-color luminous effect).

The light absorption layer LA described above is composed of the same materials as the color filter, and may be formed by the same process as the color filter. That is, the color filter and the light absorption layer LA that contain the pigments in the same color may be formed together through a single masking process. For example, when the color filter containing the pigment in the first color is formed, the first absorption layer of the light absorption layer LA is formed together. When the color filter containing the pigment in the second color is formed, the second absorption layer of the light absorption layer LA is formed together. Accordingly, this aspect makes it possible to prevent a light leakage phenomenon in the bankless structure without requiring a separate additional process for generating the light absorption layer LA.

The light absorption layer LA may be formed in the whole region of the non-emission area NEA. However, this aspect is not limited thereto. Depending on the implementation, the light absorption layer LA may be formed on the anode electrode AE within the non-emission area NEA. In an aspect, in the case where a pixel PX displays a white color, the light absorption layer LA may not be formed in the pixel PX.

When the light absorption layer LA is formed in the whole region of the non-emission area NEA, the first via hole VIA1 and the second via hole VIA2 are formed in such a manner as to penetrate through the light absorption layer LA. Alternatively, the light absorption layer LA may be constructed in such a manner as not to be formed around the first via hole VIA1 and the second via hole VIA2.

Figure 5:
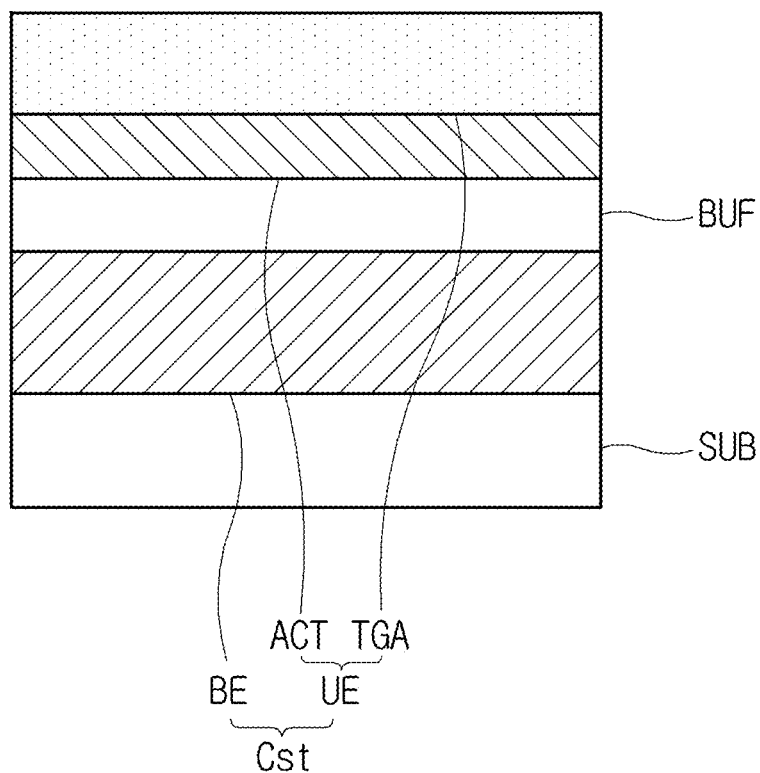
FIG. 5 is a cross-sectional view of a storage capacitor according to another aspect.

FIG. 5 is a cross-sectional view of a storage capacitor according to another aspect of the present disclosure.

As described above with reference to FIGS. 3A, 3B, and 4, in an aspect, the storage capacitor Cst may be composed of the lower electrode BE formed at the first conductive layer, and the upper electrode UE formed at the second conductive layer. Between the lower electrode BE and the upper electrode UE, the buffer layer BUF and the gate insulation layer GI are interposed.

In the case where two insulation layers are interposed between the lower electrode BE and the upper electrode UE, the distance between the electrodes BE and UE is relatively longer, resulting in a decrease in the capacitance of the storage capacitor Cst. In order to secure a desired capacitance, the areas of the lower electrode BE and the upper electrode UE need to be increased. However, when the area of the storage capacitor Cst is increased, the size of the pixel PX is increased and it is thus difficult to implement a high-resolution display device. In addition, in the case of a pixel PX displaying a white color, it is difficult to secure an aperture ratio.

In order to solve this problem, in an aspect, the upper electrode UE of the storage capacitor Cst may have a multi-layer structure in which the active layer ACT and the second conductive layer TGA overlap. Herein, the buffer layer BUF is interposed between the lower electrode BE and the upper electrode UE.

Compared with the aspect of FIG. 4, in the aspect shown in FIG. 5, only one insulation layer is interposed between the lower electrode BE and the upper electrode UE of the storage capacitor Cst. Therefore, the distance between the electrodes is relatively reduced, so that the capacitance of the storage capacitor Cst may be improved. Accordingly, an increase of the area of the storage capacitor Cst is prevented, and as a result, the size of the pixel PX is reduced and the aperture ratio of the white pixel is secured.

Figure 6:
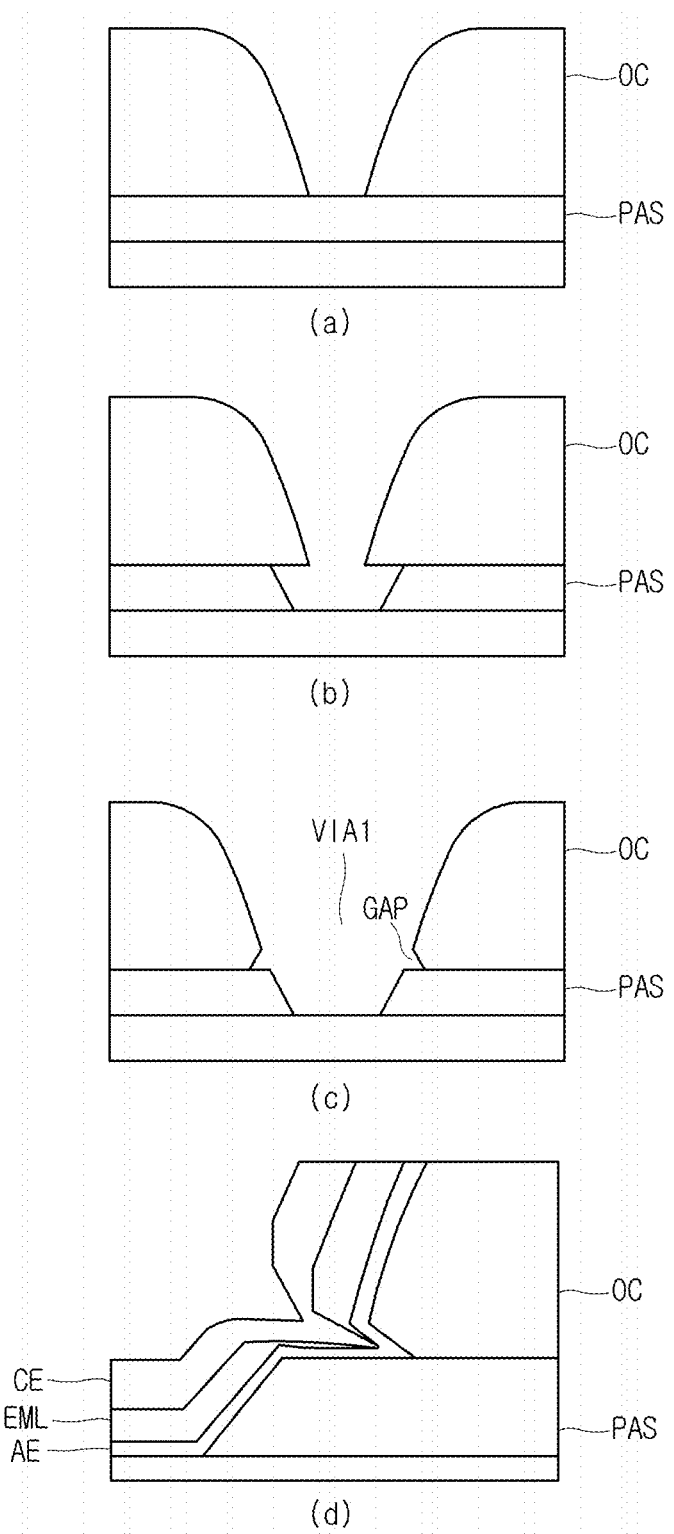
FIG. 6 is diagrams showing a problem of a short circuit in a light-emitting element which may occur in a display device having a bankless structure.
Figure 7:
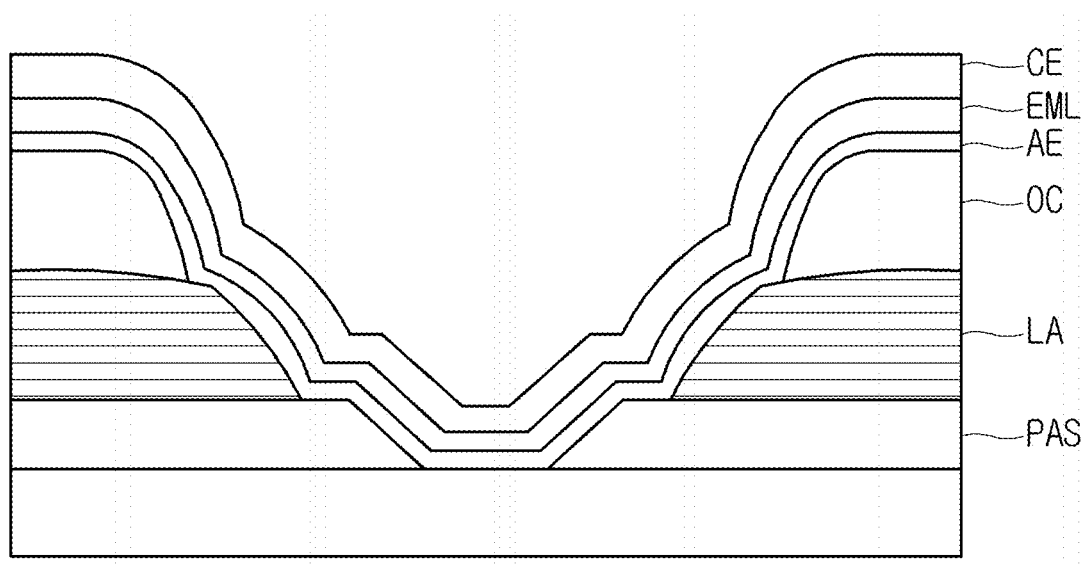
FIG. 7 is a diagram showing a method of forming a first via hole according to an aspect of the present disclosure.

(a) to (d) of FIG. 6 are diagrams showing a problem of a short circuit in a light-emitting element, which may occur in a display device having a bankless structure. FIG. 7 is a diagram showing a method of forming a first via hole according to an aspect.

As described above, the anode electrode AE of the light-emitting element LD may be connected to the upper electrode UE of the storage capacitor Cst through the first via hole VIA1 that penetrates through the overcoat layer OC and the passivation layer PAS. The first via hole VIA1 may be formed through a photo-resist (PR) process and a wet etching process.

Specifically, as shown in (a) of FIG. 6, on the passivation layer PAS, the overcoat layer OC may be exposed and developed by using a mask (photolithography). Herein, the mask may be subjected to patterning in such a manner that the overcoat layer OC is not formed at a region corresponding to the first via hole VIA1 On the exposed passivation layer PAS on which the overcoat layer OC is not formed, the residual film of the overcoat layer OC may be removed.

Afterward, a passivation hole may be formed in the exposed passivation layer PAS. Specifically, as shown in (b) of FIG. 6, with a mask applied which has an opening corresponding to the first via hole VIA1, a selective etchant capable of selectively etching the passivation layer PAS is applied, thereby forming the passivation hole.

Afterward, as shown in (c) of FIG. 6, the overcoat layer OC is etched to remove the overcoat layer OC around the passivation hole. As the overcoat layer OC is removed, the passivation hole is completely exposed to the outside, and the first via hole VIA1 penetrating through the overcoat layer OC and the passivation layer PAS is formed.

In the display device 1 having a bankless structure, the overcoat layer OC is formed in such a manner as to be thicker than that of a structure having a bank. For example, the overcoat layer OC may have a thickness of about 4.5 µm. As the overcoat layer OC becomes thick, the rate of removal of the overcoat layer OC by etching is decreased, and the overcoat layer OC thus remains at a region adjacent to the edge of the passivation hole. In addition, when the overcoat layer OC is etched, the side is excessively etched, resulting in formation of an undercut. Due to the remains of the overcoat layer OC and the undercut around the passivation hole, a gap GAP between the overcoat layer OC and the passivation layer PAS may be formed at the sidewall of the first via hole VIA1.

After the first via hole VIA1 is formed, the anode electrode AE, the emission layer EML, and the cathode electrode CE may be stacked in order on the overcoat layer OC. Herein, the anode electrode AE, the emission layer EML, and the cathode electrode CE may be stacked inside the first via hole VIA1, and may fill the inside of the gap formed at the sidewall of the first via hole VIA1.

The anode electrode AE and the cathode electrode CE having relatively good step coverage characteristics may be continuously formed around the gap without being separated due to the undercut of the overcoat layer OC. However, the emission layer EML having relatively poor step coverage characteristics may be separated around the gap due to the undercut. As the emission layer EML is separated, the anode electrode AE and the cathode electrode CE may have an electrical short circuit inside the gap as shown in (d) of FIG. 6.

In order to prevent such a short-circuit error in the light-emitting element LD, in an aspect, the first via hole VIA1 may be formed in such a manner as to penetrate through the light absorption layer LA. That is, the light absorption layer LA may be formed along the edge of the first via hole VIA1.

The light absorption layer LA is not excessively etched during the etching due to the material characteristics, and thus an undercut is not formed. The etched section has a positive taper shape. Therefore, a gap is not formed between the layers of the passivation layer PAS, the light absorption layer LA, and the overcoat layer OC, and emission layer EML and the cathode electrode CE may be continuously formed at the etched section.

In an aspect, in a region surrounding the edge of the first via hole VIA1, the light absorption layer LA may be constructed as a single absorption layer containing a pigment in a blue color as shown in FIG. 7. The pigment in a blue color has a relatively good ability to form a positive-taper section by etching. Therefore, by forming the single absorption layer containing the pigment in a blue color around the first via hole VIA1, the problem of the short circuit between the anode electrode AE and the cathode electrode CE of the light-emitting element LD may be prevented.

Referring to the aspect of FIG. 4, in an region surrounding the edge of the first via hole VIA1, the light absorption layer LA may be constructed as a single absorption layer containing the pigment in the blue color. In the remaining region, the light absorption layer LA may be constructed as multiple layers that include: the first absorption layer containing the pigment in the red color; and the second absorption layer containing the pigment in the blue color.

Figure 8:
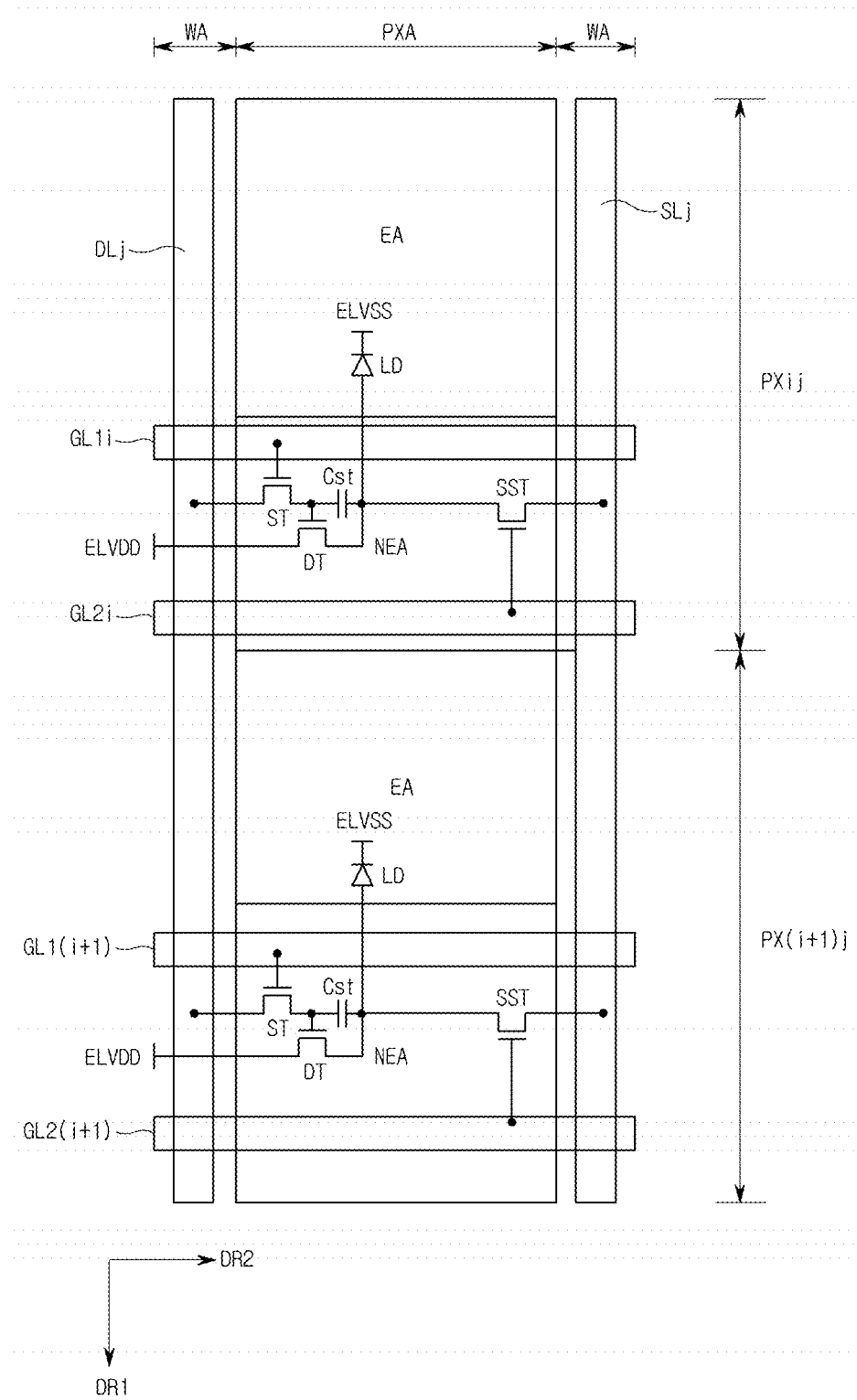
FIGS. 8 and 9 are diagrams showing a method of repairing a display device according to an aspect of the present disclosure.
Figure 9:
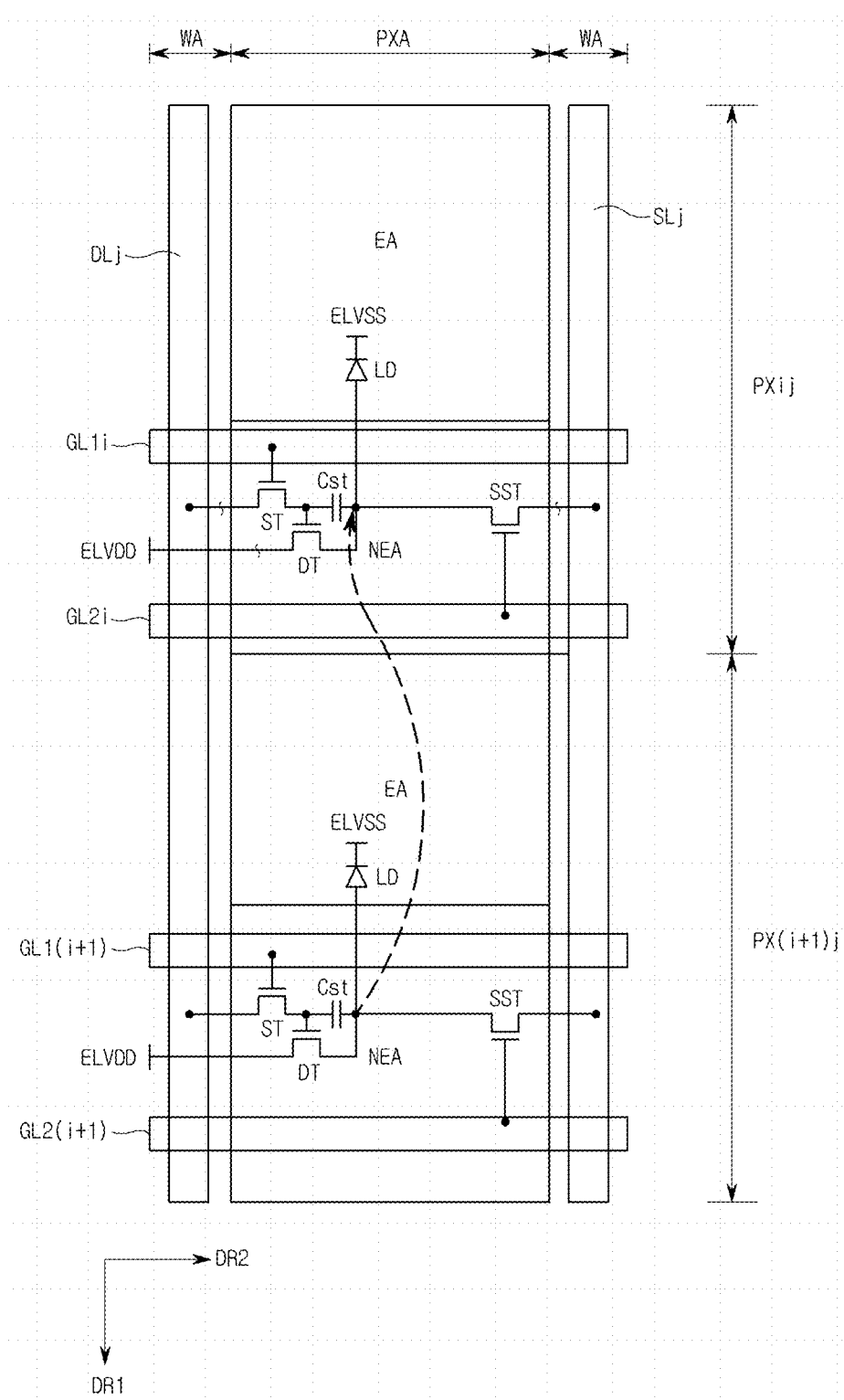
Figure 10:
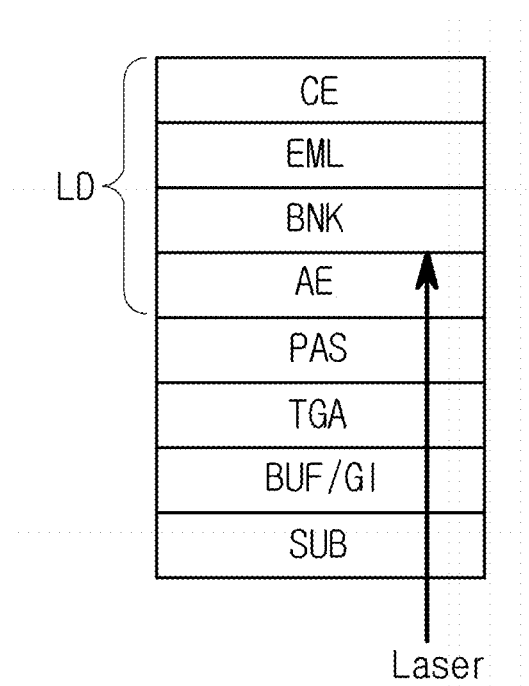
FIGS. 10 and 11 are diagrams showing a problem of a short circuit in a light-emitting element which can occur in a repair process.
Figure 11:
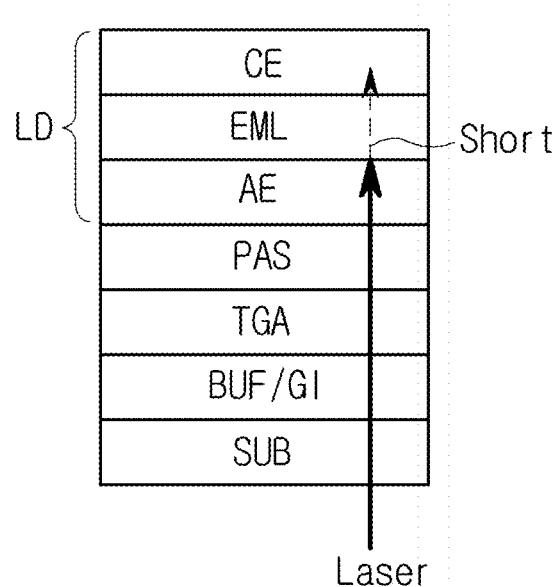
Figure 12:
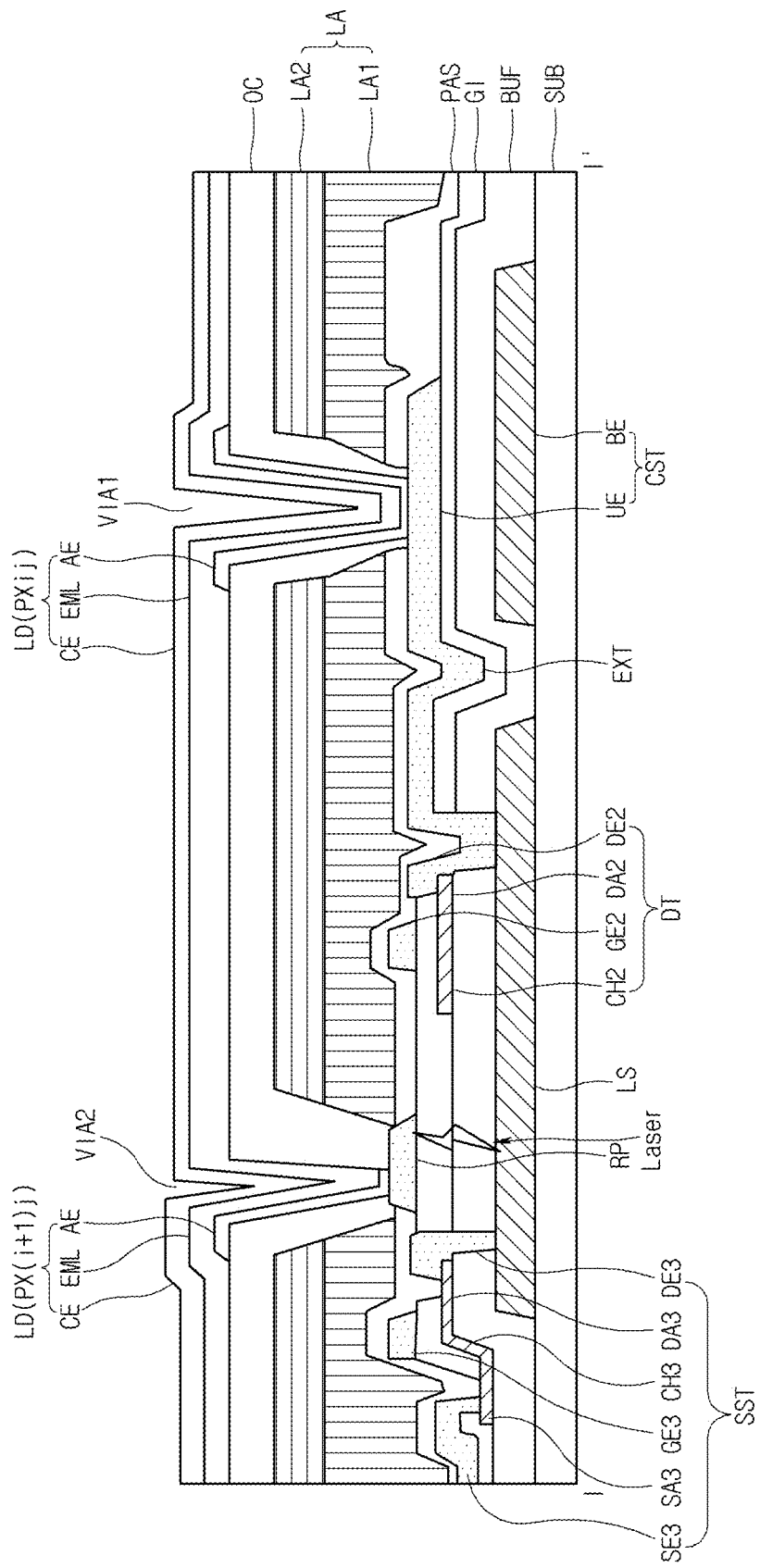
FIG. 12 is a diagram showing a method of repairing a pixel shown in FIGS. 4 and 5.

FIGS. 8 and 9 are diagrams showing a method of repairing a display device according to an aspect. FIGS. 10 and 11 are diagrams showing a problem of a short circuit in a light-emitting element which may occur in a repair process. FIG. 12 is a diagram showing a method of repairing a pixel shown in FIGS. 4 and 5.

FIGS. 8 and 9 show two pixels PXij and PX(i+1)j arranged near to each other in the first direction DR1. The pixels PXij and PX(i+1)j are arranged in a j-th pixel column, and are connected to a j-th data line DLj in common. In addition, among the pixels PXij and PX(i+1)j, a first pixel PXij is placed in an i-th pixel row and is connected to i-th gate lines GL1$i$ and GL2$i$. A second pixel PX(i+1)j is placed in an i+1-th pixel row and is connected to i+1-th gate lines GL1($i$+1) and GL2($i$+1).

Referring to FIGS. 8 and 9, the display panel 50 includes multiple pixel areas PXAs that are defined at intersection regions of the data lines (DLj), which extend in the first direction DR1, and the gate lines (GL1$i$, GL1($i$+1), GL2$i$, and GL2($i$+1)), which extend in the second direction DR2. In the pixel areas PXAs, the pixels PXij and PX(i+1)j are placed.

The pixel areas PXAs may include emission areas EAs, and non-emission areas NEAs. In the emission areas EAs, the light-emitting elements LDs of the pixels PXij and PX(i+1)j are placed. The non-emission areas NEAs include circuit elements (for example, a switching transistor ST, a driving transistors DT, a sensing transistor SST, and a storage capacitors Cst) for driving the light-emitting elements LDs. The light-emitting elements LDs are driven by the circuit elements placed in the non-emission area NEA and emit light in a particular color.

Between the pixel areas PXAs adjacent in the second direction DR2, wire areas WAs may be defined. In the wire areas WAs, the data lines (DLj) and the sensing lines (SLj) that extend in the first direction DR1 are placed. The first gate lines GL1$i$ and GL1($i$+1) and the second gate lines GL2$i$ and GL2($i$+1) extend in the second direction DR2, across the non-emission area NEA.

The data lines (DLj), the sensing lines (SLj), the first gate lines GL1$i$ and GL1($i$+1), and the second gate lines GL2$i$ and GL2($i$+1) are electrically connected to the circuit elements through contact holes. Specifically, the data lines (DLj) may be electrically connected to electrodes (for example, source electrodes) of the switching transistors STs. The sensing lines (SLj) may be electrically connected to electrodes (for example, source electrodes) of the sensing transistors SSTs. The first gate lines GL1$i$ and GL1($i$+1) are electrically connected to the gate electrodes of the switching transistors STs, and the second gate lines GL2$i$ and GL2($i$+1) are electrically connected to the gate electrodes of the sensing transistors SSTs.

In various aspects, as at least one or some of driving lines are cut, defects, such as dark spots, or the like, may occur in the corresponding pixels PXij and PX(i+1)j. For example, as shown in FIG. 9, the line between the switching transistor ST of the first pixel PXij and the j-th data line DLj, between the sensing transistor SST of the first pixel PXij and the j-th sensing line SLj, and/or between the driving transistor DT of the first pixel PXij and the first power line PL1 through which the high-potential driving voltage ELVDD is supplied, may be cut. Then, a correct driving current is not applied to the first pixel PXij, and the light-emitting element LD of the first pixel PXij does not emit light, and thus a dark spot may be viewed.

In order to repair the defective pixel PXij, the anode electrode AE of the light-emitting element LD of the first pixel PXij may be electrically connected to the anode electrode AE of the light-emitting element LD of the second pixel PX(i+1)j adjacent to the first pixel PXij, as shown in FIG. 9. Then, the driving current of the second pixel PX(i+1)j is applied to the light-emitting element LD of the first pixel PXij. Accordingly, the first pixel PXij may emit light in response to the same data signal as the second pixel PX(i+1)j, thereby repairing the dark-spot defect.

A repair process may be performed through laser welding. Specifically, the repair process may be performed by irradiating any repair pattern provided in the non-emission area NEA of the first pixel PXij with a laser beam to remove an insulation film interposed between the repair pattern RP and the anode electrode AE of the second pixel PX(i+1)j, and by forming electrical connection between the repair pattern and the anode electrode AE of the second pixel PX(i+1)j.

As described above with reference to FIG. 5, the pixels PXij and PX(i+1)j include the substrate SUB, the buffer layer BUF and the gate insulation layer GI, which are stacked on the substrate SUB in that order, the second conductive layer TGA, and the passivation layer PAS. On the passivation layer PAS, the anode electrode AE, the emission layer EML, and the cathode electrode CE of the light-emitting element LD are stacked. In the case of the display device 1 provided with a bank, in the non-emission area NEA of the pixels PXij and PX(i+1)j, a bank layer BNK for defining the emission areas EAs may be formed between the anode electrode AE and the emission layer EML.

As shown in FIG. 10, in the case where the bank layer BNK is formed in the non-emission area NEA, the laser beam with which the non-emission area NEA is irradiated is blocked by the bank layer BNK, and thus does not damage the light-emitting element LD placed at the upper layer. However, in the bankless structure in which the bank layer BNK is not formed as shown in FIG. 11, one or some layers of the light-emitting element LD may be damaged by the laser beam, causing an electrical short circuit between the anode electrode AE and the cathode electrode CE.

In order to solve this problem, in the aspect shown in FIG. 5, the repair pattern RP is placed in such a manner that a region thereof is not overlapped by the anode electrode AE of the nearby pixel PX(i+1)j, but overlaps the light-shielding layer LS. Electrode layers other than the light-shielding layer LS may not be placed on or under the region. A region of the repair pattern RP except the above-described region is electrically connected to the anode electrode AE of the nearby pixel PX(i+1)j through the second via hole VIA2.

Referring to FIG. 12, laser welding is performed on the region where the light-shielding layer LS and the repair pattern RP overlap. Because the region that is not overlapped by the anode electrode AE of the second pixel PX(i+1)j is irradiated with a laser beam, the electrical short circuit between the anode electrode AE and the cathode electrode CE may be prevented by the laser beam.

The insulation layers between the light-shielding layer LS and the repair pattern RP may be removed by laser welding, and electrical connection between the light-shielding layer LS and the repair pattern RP may be formed. Passing through the second drain electrode DE2 of the driving transistor DT of the first pixel PXij and the upper electrode UE of the storage capacitor Cst, the light-shielding layer LS is connected to the anode electrode AE of the light-emitting element LD. The repair pattern RP is connected to the anode electrode AE of the light-emitting element LD of the second pixel PX(i+1)j through the second via hole VIA2. Therefore, when the light-shielding layer LS is electrically connected to the repair pattern RP by laser welding, the anode electrode AE of the light-emitting element LD of the first pixel PXij is connected to the anode electrode AE of the light-emitting element LD of the second pixel PX(i+1)j. Then, when the driving current is applied to the anode electrode AE of the light-emitting element LD of the second pixel PX(i+1)j, the same driving current is applied to the anode electrode AE of the light-emitting element LD of the first pixel PXij, and the first pixel PXij may emit light at the same luminance as the second pixel PX(i+1)j.

Figure 13:
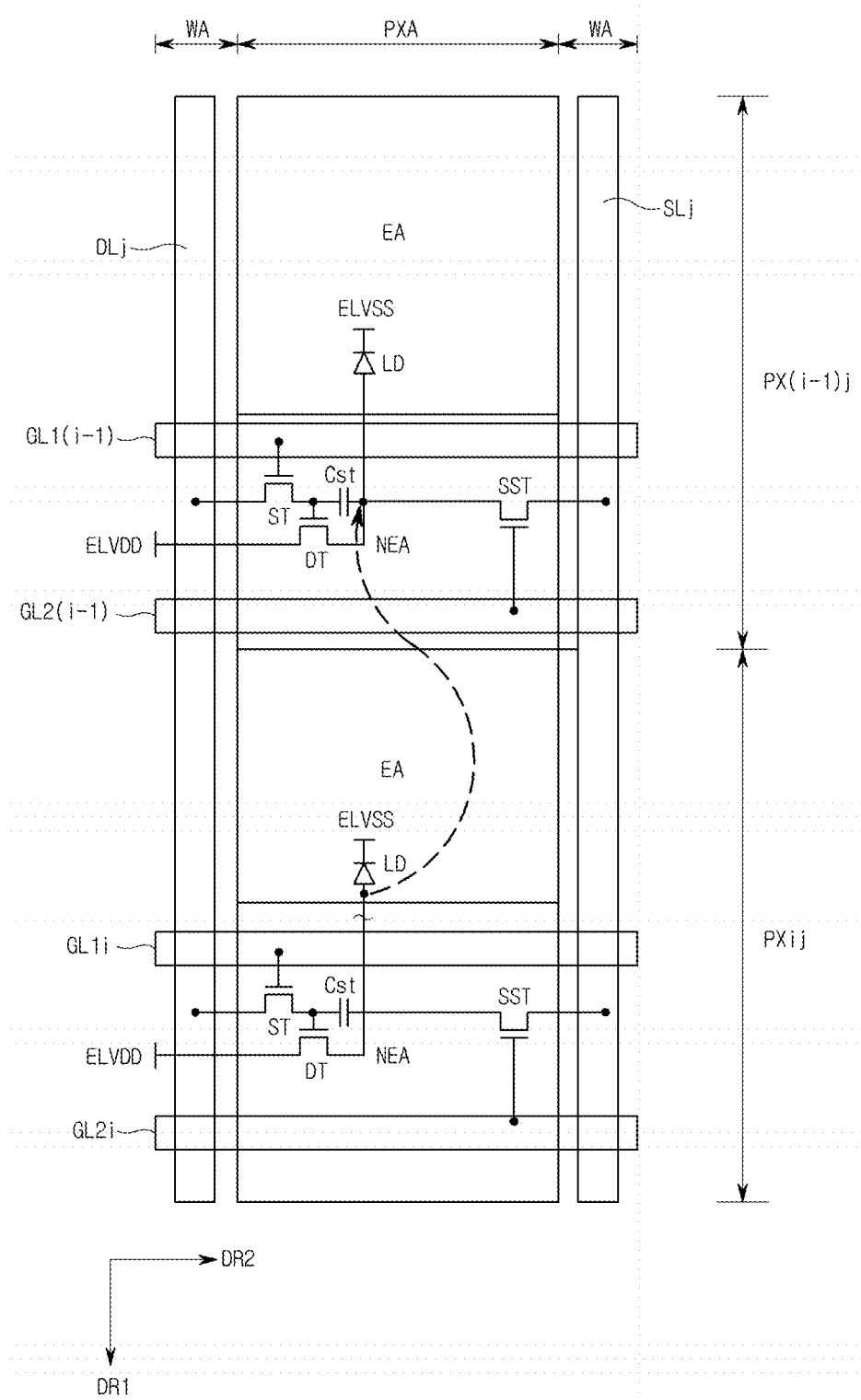
FIG. 13 is a diagram showing a method of repairing a display device according to another aspect of the present disclosure.
Figure 14:
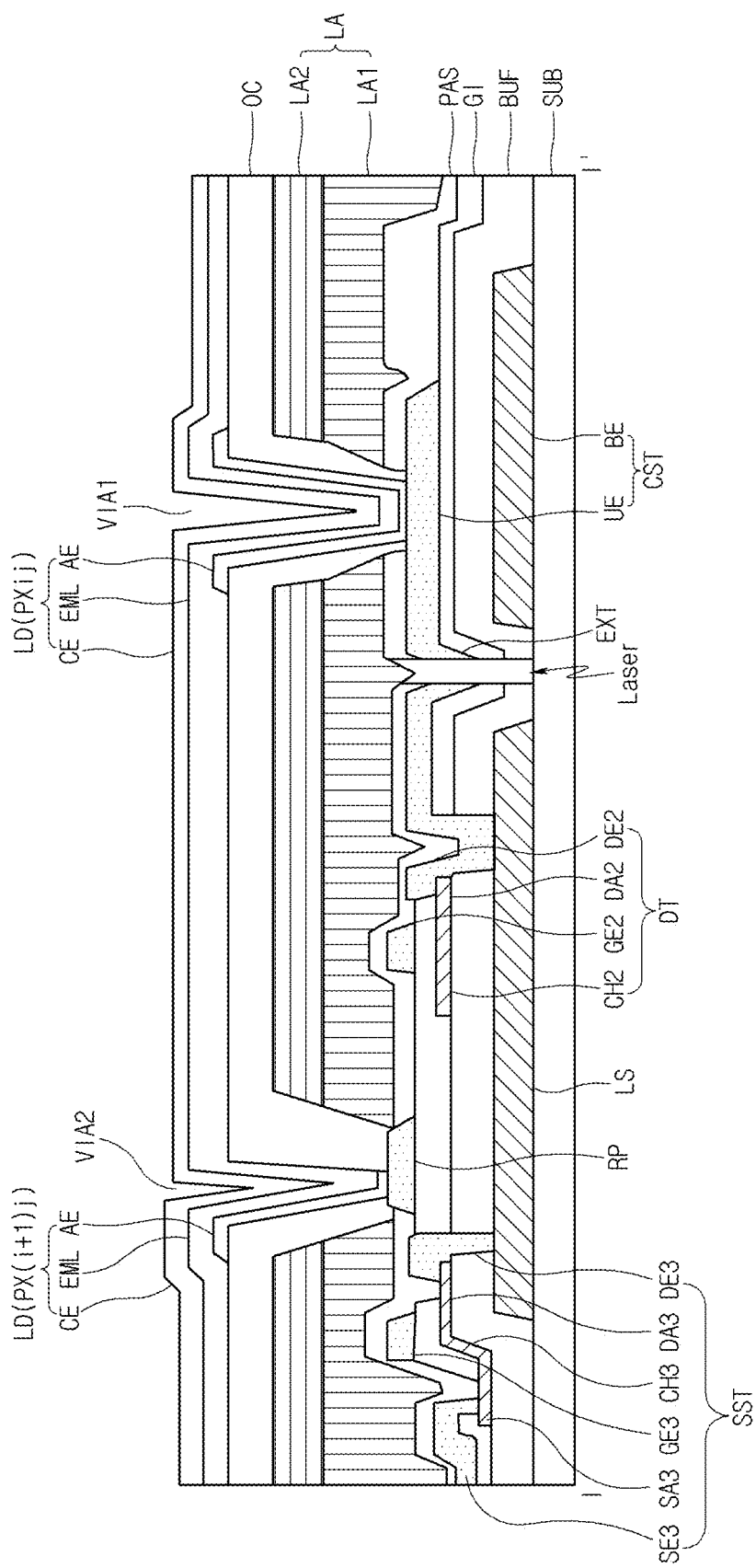
FIG. 14 is a diagram showing a method of repairing a pixel shown in FIGS. 4 and 5.

FIG. 13 is a diagram showing a method of repairing a display device according to another aspect. FIG. 14 is a diagram showing a method of repairing a pixel shown in FIGS. 4 and 5.

FIG. 13 shows two pixels PX(i−1)j and PXij arranged near to each other in the first direction DR1. The pixels PX(i−1)j and PXij are arranged in a j-th pixel column, and are connected to a j-th data line DLj in common. In addition, among the pixels PX(i−1)j and PXij, a first pixel PX(i−1)j is placed in an i−1-th pixel row and is connected to a i−1-th first gate line GL1(i−1). A second pixel PXij is placed in an i-th pixel row and is connected to an i-th first gate line GL1i.

In an aspect, a defect may occur in the driving circuit for driving the light-emitting element LD of the second pixel PXij, and thus the light-emitting element LD may not emit light correctly. In order to repair the defective pixel, for example, the second pixel PXij, the light-emitting element LD of the second pixel PXij may be separated from the driving circuit, as shown in FIG. 13. Afterward, the anode electrode AE of the light-emitting element LD of the second pixel PXij may be electrically connected to the anode electrode AE of the light-emitting element LD of a nearby pixel, for example, the first pixel PX(i−1)j. Then, the driving current of the first pixel PX(i−1)j is applied to the light-emitting element LD of the second pixel PXij. Accordingly, the second pixel PXij may emit light in response to the same data signal as the first pixel PX(i−1)j, thereby repairing the defect in the pixel.

A repair process may be performed through laser cutting and laser welding. Specifically, in the non-emission area NEA of the second pixel PXij, when the anode electrode AE of the light-emitting element LD is irradiated with a laser beam, disconnection occurs between the anode electrode AE and the driving circuit. Afterward, the anode electrode AE of the light-emitting element LD of the first pixel PX(i−1)j may be electrically connected to the anode electrode AE of the light-emitting element LD of the second pixel PXij through laser welding.

As described above with reference to FIGS. 10 and 11, laser cutting in the bankless structure may cause an electrical short circuit between the anode electrode AE and the cathode electrode CE. In order to solve this problem, in the aspect shown in FIG. 5, the lower electrode BE of the storage capacitor Cst may include an extended part EXT for connection with the second gate electrode GE2 of the driving transistor DT. On the extended part EXT, the lower electrode BE is overlapped by the second gate electrode GE2, and is electrically connected to the second gate electrode GE2 through the third contact hole CT3. At least a region of the extended part EXT is placed not to be overlapped by the other electrodes of the circuit elements and the anode electrode AE of the light-emitting element LD.

Referring to FIG. 14, laser cutting is performed on the extended part EXT. Because the region that is not overlapped by the anode electrode AE of the second pixel PXij is irradiated with a laser beam, the electrical short circuit between the anode electrode AE and the cathode electrode CE may be prevented by the laser beam.

When the extended part EXT is cut by laser cutting, the second drain electrode DE2 of the driving transistor DT and the lower electrode BE of the storage capacitor Cst are electrically separated. Passing through the extended part EXT of the lower electrode BE, the second drain electrode DE2 is connected to the anode electrode AE of the light-emitting element LD. Therefore, the driving transistor DT and the light-emitting element LD may be electrically separated by cutting of the extended part EXT.

After laser cutting, the anode electrode AE of the light-emitting element LD of the second pixel PXij may be electrically connected to the anode electrode AE of the light-emitting element LD of the first pixel PX(i−1) through laser welding. The repair method using laser welding is the same as that described with reference to FIG. 12, so a detailed description thereof will be omitted.

Figure 15:
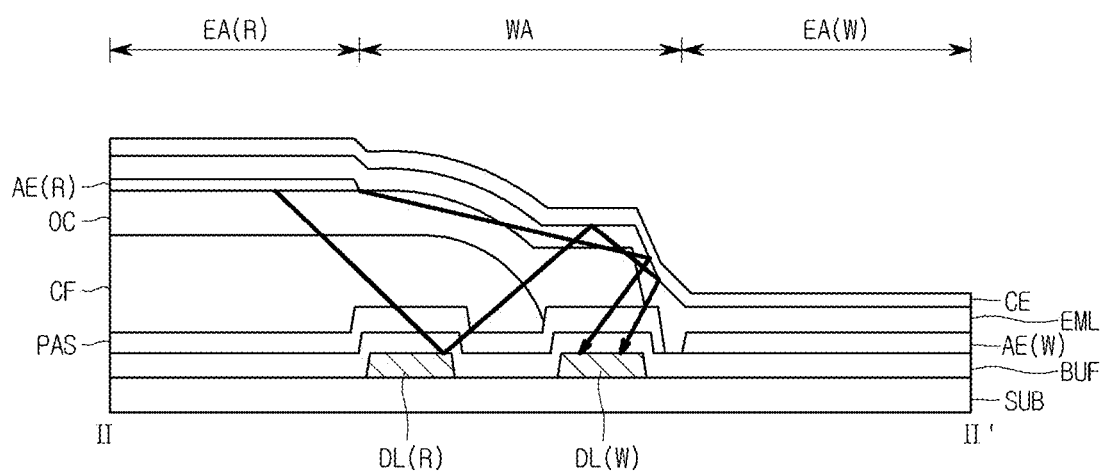
FIG. 15 is a cross-sectional view taken along line II-IF of FIG. 3A.

FIG. 15 is a cross-sectional view taken along line II-IF of FIG. 3A.

Referring to FIGS. 3A, 3B, and 4, in order for the pixel to display a required color, the light generated by the light-emitting element LD needs to be emitted outside the display panel 50 via the color filter. In the case where the pixel is constructed as having a bankless structure, light shielding is not performed around the emission area EA. Therefore, the light emitted from the light-emitting element LD is discharged to the periphery of the emission area EA and is thus emitted outside the display panel 50 without passing through the color filter. Accordingly, a light leakage and a color-fading phenomenon may occur.

In the case of a white pixel displaying a white color, a color filter is not provided, and the light generated by the light-emitting element LD is emitted outside the display panel 50 without passing through a color filter. Therefore, in the case of the white pixel, the light leakage and the color-fading phenomenon may not be a problem.

In order to solve the light leakage and the color-fading phenomenon in pixels displaying red, blue, and green colors, in an aspect, a pixel may have a structure as shown in FIG. 15.

Specifically, referring to FIG. 15, the emission area EA of the white pixel W may have a form in which the overcoat layer OC is removed, compared to FIG. 4. For example, the overcoat layer OC may be formed in a region except the emission area EA of the white pixel W through a photolithography process using a halftone mask. Accordingly, at the edge of the emission area EA of the white pixel W, the overcoat layer OC has the difference in level.

After the overcoat layer OC is formed, the anode electrode AE of each of the pixels in the emission area EA may be formed in a pattern. In a red pixel R, the anode electrode AE is formed on the overcoat layer OC. Since the overcoat layer OC is not formed in the white pixel W, the anode electrode AE may be formed on the buffer layer BUF, which is the lower layer. In the shown aspect, in the case of the white pixel W, the anode electrode AE is formed on the buffer layer BUF, but this aspect is not limited thereto. That is, in various aspects, the passivation layer PAS may be formed in the emission area EA of the white pixel W. Herein, the anode electrode AE may be formed on the passivation layer PAS. That is, excluding the overcoat layer OC, the anode electrode AE may be formed on the exposed lower layer of the emission area EA.

Afterward, the emission layer EML and the cathode electrode CE may be formed. Along the overcoat layer OC provided with the difference in level, the emission layer EML and the cathode electrode CE also have the difference in level at the edge of the emission area EA of the white pixel W. In the region with the difference in level, the emission layer EML and the cathode electrode CE cover the exposed side of the overcoat layer OC, and thus have a bend around the step. Herein, the bend may include at least one angular shape or at least one curved-surface shape.

When light is emitted from the light-emitting element LD of the red pixel R, light discharged to the non-emission area NEA in which a color filter CF is not formed goes in the direction of the nearby white pixel W. This light reflects off the bend of the cathode electrode CE, and the traveling direction of the light may be controlled toward a lower position of the display panel 50. By the data line DL placed along the edge of the emission area EA of the white pixel W, the reflected light may be blocked from being emitted outside the display panel 50.

As described above, in the display panel 50 according to an aspect, the difference in level of the cathode electrode CE is formed at a periphery of another nearby pixel through removal of the overcoat layer OC of the white pixel W. Then, the light discharged from the light-emitting element LD to the non-emission area NEA in which the color filter CF is not formed reflects off the cathode electrode CE, and is blocked by a conductive layer, such as the data line DL, or the like, of the lower layer, thereby solving the light leakage and the color-fading phenomenon.

Figure 16:
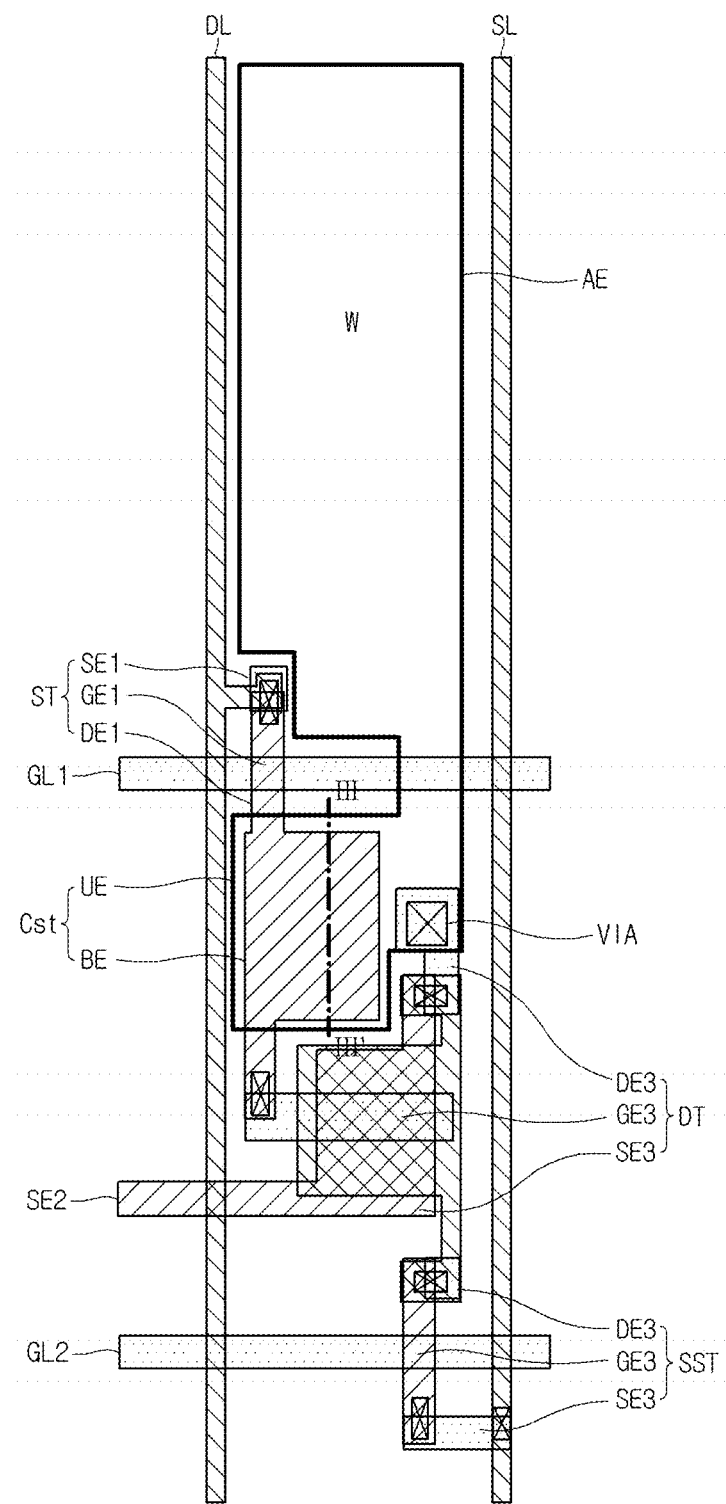
FIG. 16 is a diagram showing a plane layout of a white pixel according to another aspect of the present disclosure.
Figure 17:
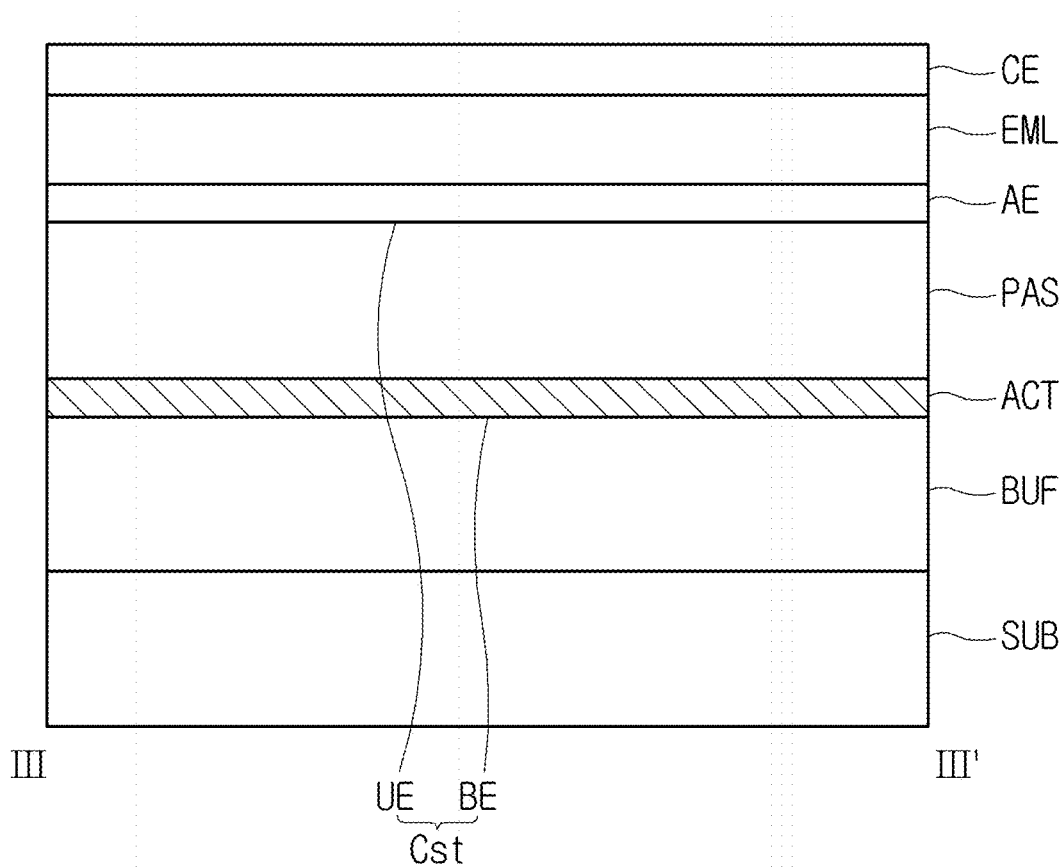
FIG. 17 is a cross-sectional view taken along line of FIG. 16.

FIG. 16 is a diagram showing a plane layout of a white pixel according to another aspect. FIG. 17 is a cross-sectional view taken along line of FIG. 16.

Referring to FIGS. 2 and 16 together, a pixel PX may include a switching transistor ST, a driving transistor DT, a sensing transistor SST, a storage capacitor Cst, and a light-emitting element LD.

The switching transistor ST may include a first gate electrode GE1, a first source electrode SE1, and a first drain electrode DE1.

The first gate electrode GE1 may be placed overlapping a first channel formed in an active layer ACT. The first channel may be a semiconductor pattern to which impurities are not doped within the active layer ACT. The first gate electrode GE1 may be electrically connected to the first gate line GL1. For example, the first gate electrode GE1 may be a region overlapping the first channel on the first gate line GL1.

The first source electrode SE1 may be connected to a source area formed on a first side of the first channel in the active layer ACT. The first source electrode SE1 may be further connected to the data line DL through a contact hole.

The first drain electrode DE1 may be a drain area formed on a second side of the first channel in the active layer ACT.

The first drain electrode DE1 may be formed being integrated with a lower electrode BE of the storage capacitor Cst.

The driving transistor DT may include a second gate electrode GE2, a second source electrode SE2, and a second drain electrode DE2.

The second gate electrode GE2 may be placed overlapping a second channel formed in the active layer ACT. The second gate electrode GE2 may be electrically connected to the lower electrode BE of the storage capacitor Cst through a contact hole.

The second source electrode SE2 may be a second source area formed on a first side of the second channel in the active layer ACT. The second source electrode SE2 may be electrically connected to the first power line PL1 through which the high-potential driving voltage ELVDD is applied.

The second drain electrode DE2 may be connected to a second drain area formed on a second side of the second channel in the active layer ACT. The second drain electrode DE2 may be connected to an anode electrode AE of the light-emitting element LD through a via hole VIA.

In addition, the second drain electrode DE2 may be connected to a light-shielding layer LS through a contact hole. The light-shielding layer LS is connected to the third drain electrode DE3 of the sensing transistor SST. Therefore, the second drain electrode DE2 may be connected to the third drain electrode DE3 of the sensing transistor SST through the light-shielding layer LS.

The sensing transistor SST may include a third gate electrode GE3, a third source electrode SE3, and a third drain electrode DE3.

The third gate electrode GE3 may be placed overlapping a third channel formed in the active layer ACT. The third gate electrode GE3 may be electrically connected to the second gate line GL2. For example, the third gate electrode GE3 may be a region overlapping the third channel on the second gate line GL2.

The third source electrode SE3 may be connected to a third source area formed on a first side of the third channel in the active layer ACT. The third source electrode SE3 may be electrically connected to the sensing line SL through a contact hole.

The third drain electrode DE3 may be connected to a third drain area formed on a second side of the third channel in the active layer ACT. In addition, the third drain electrode DE3 may be connected to the light-shielding layer LS through a contact hole. Passing through the light-shielding layer LS, the third drain electrode DE3 is electrically connected to the second drain electrode DE2 of the driving transistor DT and the anode electrode AE.

The storage capacitor Cst may include the lower electrode BE and an upper electrode UE.

The lower electrode BE constitutes the active layer ACT. The lower electrode BE may be electrically connected to the first drain electrode DE1 of the switching transistor ST through a contact hole. In addition, the lower electrode BE may be electrically connected to the second gate electrode GE2 of the driving transistor DT through a contact hole.

The upper electrode UE is formed in such a manner that at least a region thereof covers the lower electrode BE. Between the upper electrode UE and the lower electrode BE, electric charges corresponding to the potential difference between the two electrodes are stored, so that the upper electrode UE and the lower electrode BE may operate as a storage capacitor Cst.

The upper electrode UE is constructed as a region of the anode electrode AE. That is, the upper electrode UE may be an extended part for the non-emission area NEA of the anode electrode AE formed in the emission area EA.

The upper electrode UE may be electrically connected to the second drain electrode DE2 of the driving transistor DT through a via hole VIA.

The light-emitting element LD may include the anode electrode AE, the cathode electrode CE, and an emission layer EML placed between the anode electrode AE and the cathode electrode CE.

Generally, the anode electrode AE is formed in the emission area EA, and is provided with a region extending to the non-emission area NEA. The extended region may be placed in such a manner as to overlap the lower electrode BE of the storage capacitor Cst, and may constitute the upper electrode UE of the storage capacitor Cst. In this aspect, the extended region may have a sufficient area so as to secure the storage capacitance of the storage capacitor Cst.

On the anode electrode AE, the emission layer EML and the cathode electrode CE are formed. The emission layer EML and the cathode electrode CE may be formed to be wide in the emission area EA and the non-emission area NEA. Herein, as the emission layer EML and the cathode electrode CE are stacked on the extended region of the anode electrode AE extending to the non-emission area NEA, light may be emitted from the non-emission area NEA. This has the effect of substantially extending the emission area EA of the white pixel W.

Referring to FIG. 17, the storage capacitor Cst include the lower electrode BE formed in the active layer ACT, and the upper electrode UE constructed as the extended region of the anode electrode AE. As the upper electrode UE is constructed as the anode electrode AE, the upper electrode UE of the storage capacitor Cst may emit light.

The aspect described with reference to FIG. 15 may be applied to the aspect of FIGS. 16 and 17. That is, the overcoat layer OC may not be formed in the emission area EA of the white pixel W. In the aspect of FIGS. 16 and 17, since the upper electrode UE of the storage capacitor Cst is constructed as the anode electrode AE and substantially extends the emission area EA, the overcoat layer OC may not be formed in the region where the upper electrode UE is placed.

In this aspect, between the lower electrode BE and the upper electrode UE of the storage capacitor Cst, at least one insulation layer interposed between the active layer ACT and the anode electrode AE may be interposed, except the overcoat layer OC. For example, between the lower electrode BE and the upper electrode UE, a passivation layer PAS may be interposed.

Figure 18:
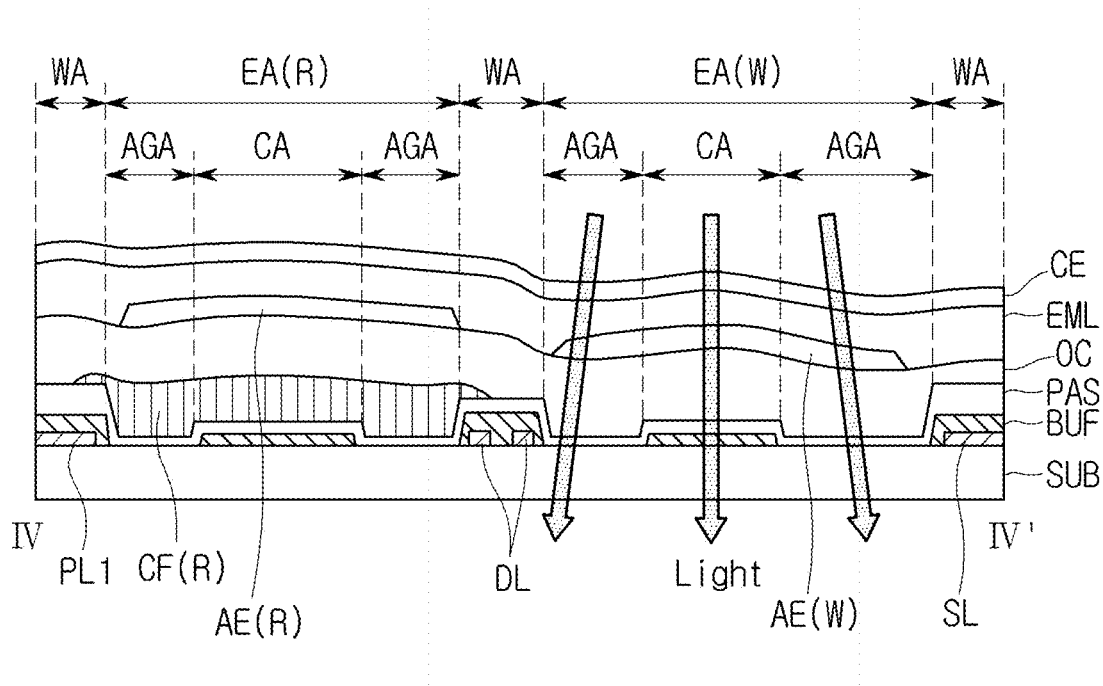
FIG. 18 is a cross-sectional view taken along line IV-IV' of FIG. 3A.

FIG. 18 is a cross-sectional view taken along line IV-IV' of FIG. 3A.

Referring to FIG. 18, the display panel 50 includes emission areas EA(R) and EA(W) of pixels PXs, and wire areas WAs placed between the emission areas EA(R) and EA(W). In the wire areas WAs, the first power line PL1, the data line DL, the sensing line SL, and the like are placed. In the emission areas EA(R) and EA(W), anode electrodes AE(R) and AE(W), the emission layer EML, and the cathode electrode CE are stacked, so that light in corresponding colors is emitted.

In the wire areas WAs and the emission areas EA(R) and EA(W), the circuit elements (for example, the transistors DT, ST, and SST, and the storage capacitor Cst) described above with reference to FIGS. 3A, 3B, and 4 are not placed, so that the active layer ACT, the gate insulation layer GI, and the second conductive layer are not formed.

Specifically, in the wire areas WAs, the second conductive layer including the first power line PL1, the data line DL, and the sensing line SL is formed on the substrate SUB, and the buffer layer BUF covering the second conductive layer is formed. On the buffer layer BUF, the passivation layer PAS and the overcoat layer OC are formed. In the above-described aspects, since the display panel 50 includes the emission layer EML and the cathode electrode CE that are formed to be wide above the substrate SUB, the emission layer EML and the cathode electrode CE are formed on the overcoat layer OC in the wire area WA.

In the emission areas EA(R) and EA(W), the buffer layer BUF is formed on the substrate SUB, and the passivation layer PAS and the overcoat layer OC are formed on the buffer layer BUF. In the emission areas EA(R), EA(W), EA(B), and EN(G), the anode electrodes AE(R) and AE(W), the emission layer EML, and the cathode electrode CE are stacked on the overcoat layer OC. In the emission areas EA(R) and EA(W), a color filter CF(R) may be formed between the passivation layer PAS and the overcoat layer OC. In the case where a pixel PX displays a white color, a color filter may be omitted in the emission area EA(W) of the pixel PX.

In the display panel 50 according to the aspect, a bank BNK (see FIG. 10) covering the edges of the anode electrodes AE(R) and AE(W) is not formed, so that the edges of the anode electrodes AE(R) and AE(W) are directly covered by the emission layer EML and the cathode electrode CE. Accordingly, light may also be generated at the edges of the anode electrodes AE(R) and AE(W).

Compared to the emission areas EA(R) and EA(W), the circuit element layer in the wire area WA further includes the first conductive layer (PL1, DL, and SL). Accordingly, in an aspect, the insulation layers (BUF, PAS, and OC) are formed in a concave shape in which the upper surface is high in the wire area WA and the upper surface is low in the emission areas EA(R) and EA(W). Herein, the difference in height between the valley and the ridge of the overcoat layer OC may be determined depending on the thickness of the first conductive layer (PL1, DL, and SL). For example, the difference in height between the valley and the ridge of the overcoat layer OC may be about 5500 Å, but is not limited thereto.

When the upper surface of the overcoat layer OC has a concave shape, the anode electrodes AE(R) and AE(W) that depend on a profile of the upper surface of the overcoat layer OC are also formed in a concave shape.

In an aspect, when a color filter CF is formed between the passivation layer PAS and the overcoat layer OC, the difference in height between the valley and the ridge of the overcoat layer OC is somewhat reduced. However, even in this case, depending on the thickness of the buffer layer BUF, the upper surface of the overcoat layer OC may be formed to be substantially concave.

When the anode electrodes AE(R) and AE(W) are formed in a concave shape, light generated through the anode electrodes AE(R) and AE(W) is emitted outward from the edges of the anode electrodes AE(R) and AE(W), resulting in a decrease in light extraction efficiency. In order to prevent this problem, this aspect provides a structure of the display panel 50 in which the anode electrodes AE(R) and AE(W) are not formed in a concave shape, but have a substantially flat profile.

Specifically, as shown in FIG. 18, the buffer layer BUF is not formed in edge areas AGAs of the emission areas EA(R) and EA(W). That is, the buffer layer BUF is formed only in central areas CAs in the emission areas EA(R) and EA(W).

The overcoat layer OC formed above the buffer layer BUF has a shape in which the upper surface of the overcoat layer OC is high in the central area CA where the buffer layer BUF is formed and the upper surface of the overcoat layer OC is low in the edge area AGA where the buffer layer BUF is not formed. That is, the overcoat layer OC may have a substantially convex shape in which the upper surface of the overcoat layer OC is high in the central areas CAs of the emission areas EA(R) and EA(W) and the upper surface of the overcoat layer OC is low in the edge areas AGAs. Alternatively, the overcoat layer OC may have a shape in which the surface is substantially uniform in height in all regions of the emission areas EA(R) and EA(W).

The anode electrodes AE(R) and AE(W) formed on the overcoat layer OC are formed to be convex along the profile of the upper surface of the overcoat layer OC or substantially flat. Then, light generated through the anode electrodes AE(R) and AE(W) is discharged within the emission areas EA(R) and EA(W) or within at least a region adjacent to the emission areas EA(R) and EA(W), so that light extraction efficiency may be improved.

The buffer layer BUF may be formed in a pattern through the patterning process of the gate insulation layer GI in the pixel area PXA described with reference to FIGS. 3A, 3B, and 4. In general, when the buffer layer BUF is made of a material having the same or similar characteristic as the gate insulation layer GI, the buffer layer BUF is also etched by the etching material for forming the gate insulation layer GI in a pattern. Therefore, when a mask process for forming the gate insulation layer GI in a pattern is performed in the pixel area PXA, an opening for etching the buffer layer BUF in the edge areas AGAs of the emission areas EA(R) and EA(W) is formed in the mask, thereby forming the buffer layer BUF in a pattern. Accordingly, in this aspect, an additional process for forming the buffer layer BUF in a pattern is not required, and light extraction efficiency of the light-emitting element LD in the bankless structure may be improved. In addition, in this aspect, the thickness of the insulation layer is reduced in some of the emission areas EA(R) and EA(W), so that transmittance is improved, and a light leakage phenomenon in the edges of the emission areas EA(R) and EA(W) is solved.

FIG. 18 shows, as an example, only the pixel generating light in a red color and the pixel generating light in a white color, but this aspect is not limited thereto and may be applied to all pixels generating light in various colors.

In addition, generally, this aspect may be applied to a white pixel W in which the upper surface of the overcoat layer OC is uneven due to the color filter CF, but no limitation thereto is imposed. That is, this aspect may be applied to pixels in various colors in which the color filter CF is formed.

Figure 19:
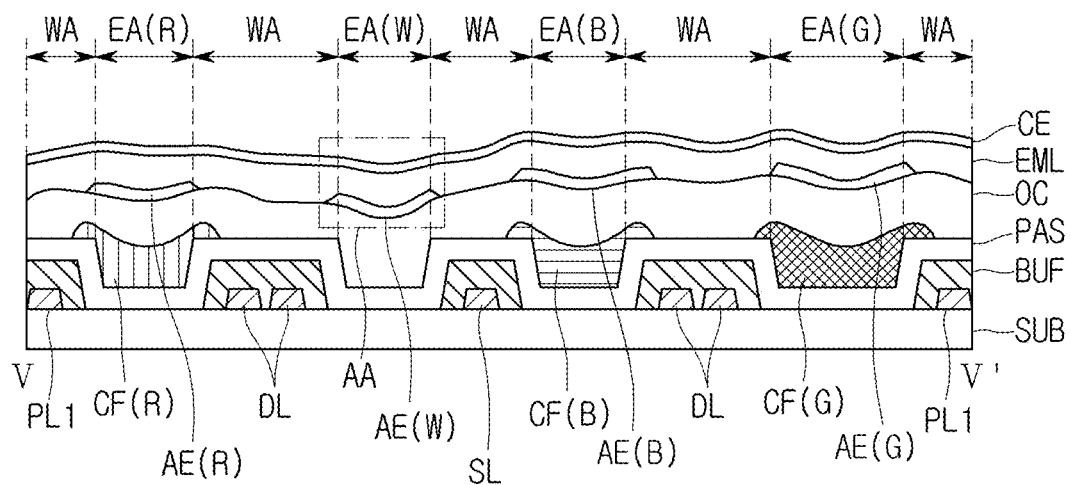
FIG. 19 is a cross-sectional view taken along line V-V' of FIG. 3A.
Figure 20:
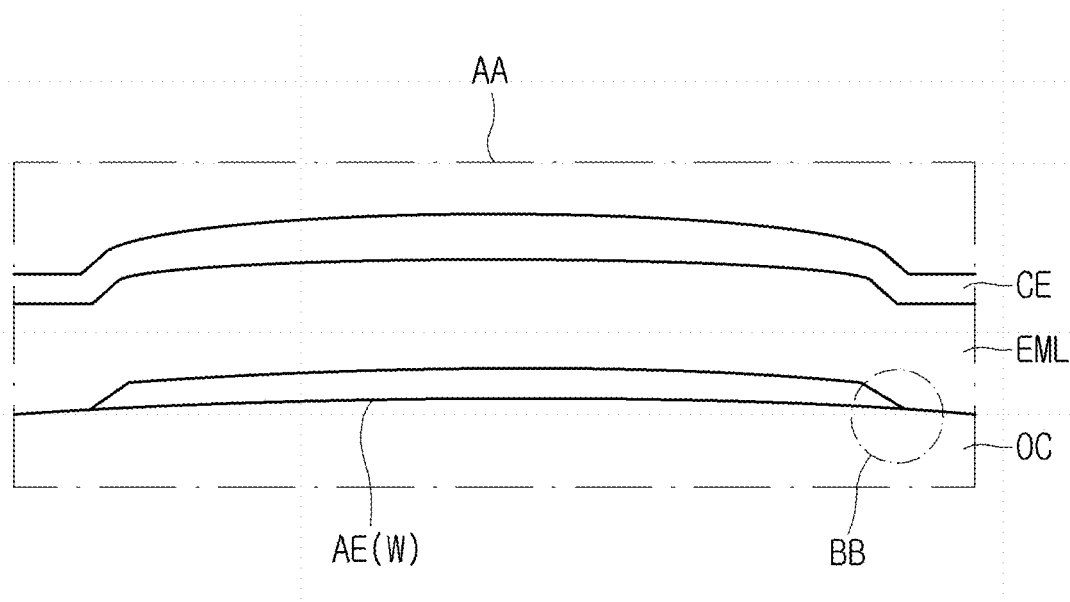
FIG. 20 is an enlarged view of area AA of FIG. 19 as an example.
Figure 21:
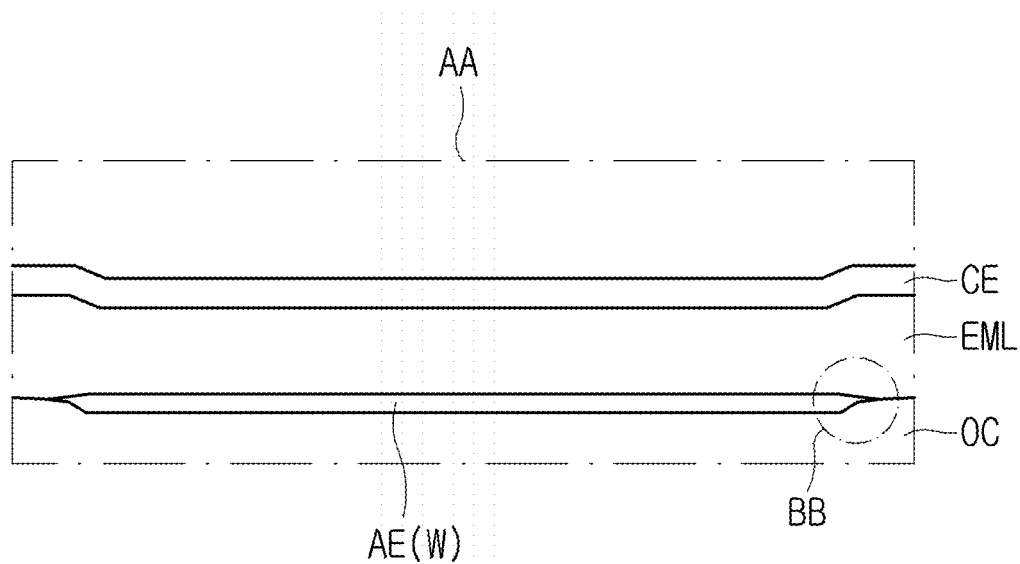
FIG. 21 is an enlarged view of area AA of FIG. 19 as another example.

FIG. 19 is a cross-sectional view taken along line V-V' of FIG. 3A. FIG. 20 is an enlarged view of area AA of FIG. 19 as an example. FIG. 21 is an enlarged view of area AA of FIG. 19 as another example.

Referring to FIG. 19, the display panel 50 includes emission areas EA(R), EA(W), EA(B), and EA(G) of pixels PXs, and wire areas WAs placed between the emission areas EA(R), EA(W), EA(B), and EA(G). In the wire areas WAs, the first power line PL1, the data line DL, the sensing line SL, and the like are placed. In the emission areas EA(R), EA(W), EA(B), and EA(G), anode electrodes AE(R), AE(W), AE(B), and AE(G), the emission layer EML, and the cathode electrode CE are stacked, so that light in corresponding colors is emitted.

In the wire areas WAs, the second conductive layer including the first power line PL1, the data line DL, and the sensing line SL is formed on the substrate SUB, and the buffer layer BUF covering the second conductive layer is formed. On the buffer layer BUF, the passivation layer PAS and the overcoat layer OC are formed. In the above-described aspects, since the display panel 50 includes the emission layer EML and the cathode electrode CE that are formed to be wide above the substrate SUB, the emission layer EML and the cathode electrode CE are formed on the overcoat layer OC in the wire area WA.

In the emission areas EA(R), EA(W), EA(B), and EA(G), the buffer layer BUF is formed on the substrate SUB, and the passivation layer PAS and the overcoat layer OC are formed on the buffer layer BUF. In the emission areas EA(R) and EA(W), the anode electrodes AE(R), AE(W), AE(B), and AE(G), the emission layer EML, and the cathode electrode CE are stacked on the overcoat layer OC.

In some emission areas EA(R), EA(B), and EA(G) among the emission areas EA(R), EA(W), EA(B), and EA(G), color filters CF(R), CF(B), and CF(G) may be formed between the passivation layer PAS and the overcoat layer OC. When the overcoat layer OC is formed on the color filters CF(R), CF(B), and CF(G), the overcoat layer OC is formed in a convex shape in which the upper surface of the overcoat layer OC is relatively high in regions where the color filters CF(R), CF(B), and CF(G) are formed and is relatively low in regions where the color filters CF(R), CF(B), and CF(G) are not formed.

When the upper surface of the overcoat layer OC has a convex shape, the anode electrodes AE(R), AE(B), and AE(G) that depend on the profile of the upper surface of the overcoat layer OC also have a substantially convex shape according to the profile of the upper surface of the overcoat layer OC.

In general, the anode electrodes AE(R), AE(B), and AE(G) are generated by depositing a material on the overcoat layer OC, by hardening the material, and then by performing patterning with a mask. During the mask process, the sides of the anode electrodes AE(R), AE(B), and AE(G) are formed in a substantially tapered shape.

As shown in area BB of FIG. 20, when the anode electrodes AE(R), AE(B), and AE(G) are formed in a convex shape, the degree of tapering at the side is increased. As in this aspect, in the bankless structure, the top surfaces of the anode electrodes AE(R), AE(B), and AE(G) emit light being covered by the emission layer EML and the cathode electrode CE. Therefore, when the degree of tapering at the side is increased, a phenomenon of over light emission occurs at the edge. That is, in practice, the light-emitting element LD emits light with an undesired area of which the edges extend beyond the area of the emission area EA with which the light-emitting element LD is expected to emit light.

In order to prevent this problem, the aspect provides a structure of the display panel 50 in which the anode electrodes AE(R), AE(B), and AE(G) are not formed in a convex shape, but have a substantially flat or concave profile.

Specifically, as shown in FIG. 19, the buffer layer BUF is not formed in the emission areas EA(R), EA(B), and EA(G). That is, the buffer layer BUF is formed only in the wire area WA and the non-emission area NEA.

The overcoat layer OC formed above the buffer layer BUF has a shape in which the upper surface of the overcoat layer OC is high in the region where the buffer layer BUF is formed and the upper surface of the overcoat layer OC is low in the region where the buffer layer BUF is not formed. That is, the overcoat layer OC may have a substantially concave shape in which the upper surface of the overcoat layer OC is relatively low in the emission areas EA(R), EA(B), and EA(G). Alternatively, the overcoat layer OC may have a shape in which the surface is substantially uniform in height in all regions on the display panel 50.

The anode electrodes AE(R), AE(B), and AE(G) formed on the overcoat layer OC are formed to be concave along the profile of the upper surface of the overcoat layer OC or substantially flat. Herein, a part of the edge of the side surface and/or the upper surface of the anode electrodes AE(R), AE(B), and AE(G) may be covered by the overcoat layer OC.

In this aspect, as shown in area BB of FIG. 21, the degree of tapering at the side of the anode electrodes AE(R), AE(B), and AE(G) is decreased, so that over light emission at the edge is prevented. When the phenomenon of over light emission is reduced, the lifespan of the light-emitting element LD is lengthened and light extraction efficiency is improved The buffer layer BUF may be formed in a pattern through the patterning process of the gate insulation layer GI in the pixel area PXA described with reference to FIGS. 3A, 3B, and 4. Accordingly, in this aspect, an additional process for forming the buffer layer BUF in a pattern is not required, and light extraction efficiency of the light-emitting element LD in the bankless structure may be improved. In addition, in this aspect, the thickness of the insulation layer is reduced in the emission areas EA(R), EA(B), and EA(G), so that transmittance is improved.

It has been described that in general, this aspect is applied to pixels PXs in which the upper surface of the overcoat layer OC is uneven due to the color filter CF. However, this aspect is not limited thereto, and may be applied to pixels in which the color filter CF is not formed, for example, a white pixel W, and the like.

Figure 22:
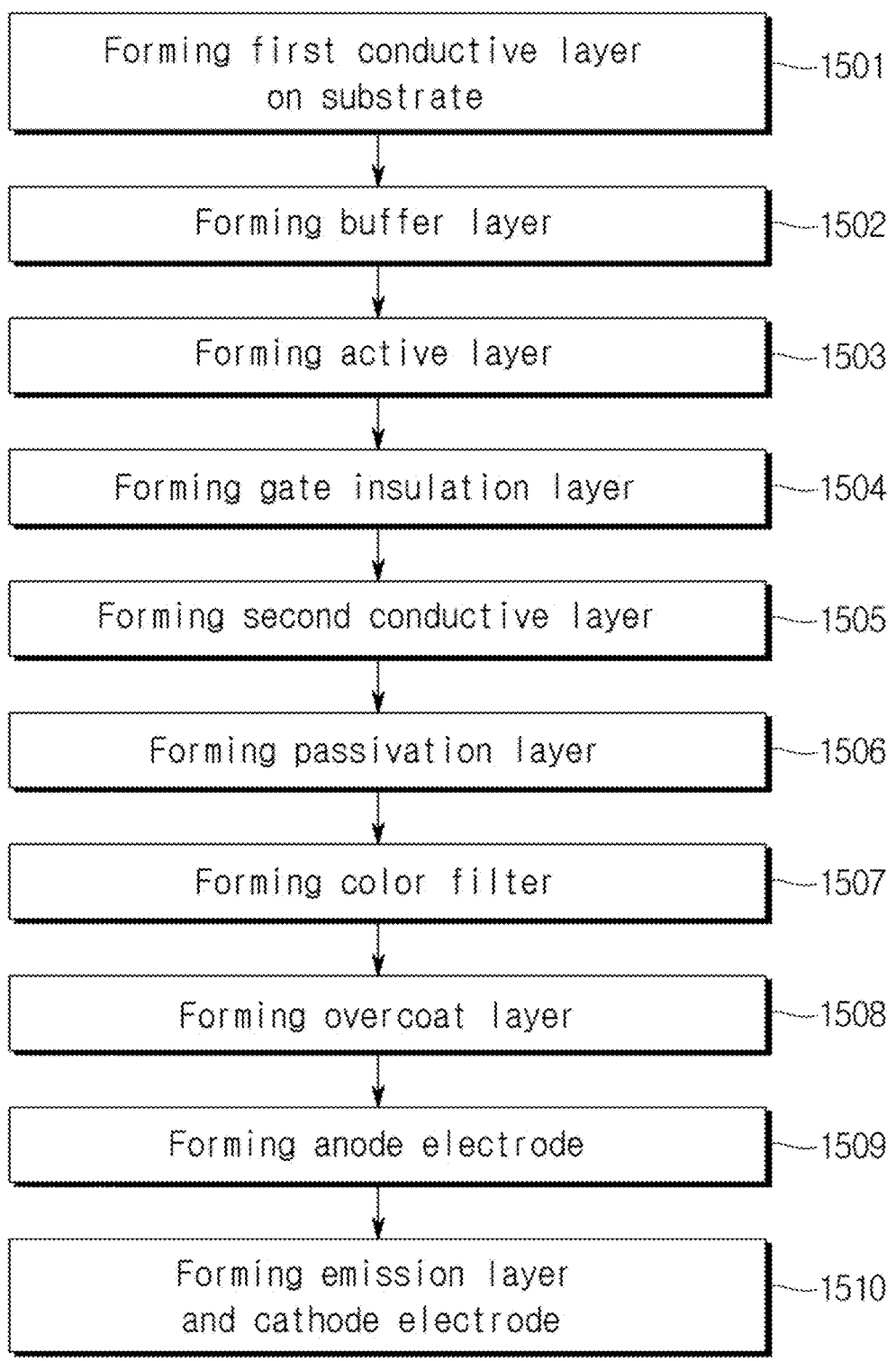
FIG. 22 is a flowchart showing a method of manufacturing a display device according to an aspect of the present disclosure.

FIG. 22 is a flowchart showing a method of manufacturing a display device according to an aspect. Specifically, FIG. 22 shows a method of manufacturing the display panel 50 that has the pixels (PXij) described above with reference to FIGS. 3A, 3B, and 4.

Referring to FIG. 22 with FIGS. 3A, 3B, and 4, first, the circuit element layer may be formed on the substrate SUB. Specifically, the first conductive layer may be formed on the substrate SUB at step 1501. The first conductive layer may be generated by forming a conductive film on the substrate SUB through a printing process, a sputtering process, a chemical vapor deposition process, a pulsed laser deposition (PLD) process, a vacuum deposition process, an atomic layer deposition process, or the like; and by performing patterning through an etching process using a mask. Herein, a first mask may be used.

Afterward, the buffer layer BUF may be formed on the first conductive layer at step 1502. The buffer layer BUF may be formed through a chemical vapor deposition process, a spin coating process, a plasma-enhanced chemical vapor deposition process, a sputtering process, a vacuum deposition process, a high-density plasma-chemical vapor deposition process, a printing process, or the like.

The active layer ACT may be formed on the buffer layer BUF at step 1503. For example, an amorphous silicon layer may be formed on the buffer layer BUF, and the amorphous silicon layer may crystallize to form a polysilicon layer. Afterward, the polysilicon layer is subjected to patterning through photolithography, or the like, thereby forming the active layer ACT. Herein, a second mask may be used for the photolithography process. Impurities are injected into the polysilicon layer constituting the active layer ACT so that the source areas SA1, SA2, and SA3, the drain areas DA1, DA2, and DA3, and the channels CH1, CH2, and CH3 are formed. In the buffer layer BUF, contact holes for enabling the first conductive layer and the upper layer to be in contact with each other may be further formed.

The gate insulation layer GI may be formed on the active layer ACT at step 1504. The gate insulation layer GI may be selectively formed in a region where the second conductive layer is to be formed, which will be described later. Specifically, the gate insulation layer GI may be formed through photolithography, or the like, in which the gate insulation layer GI is exposed and developed by using a mask. Herein, a third mask may be used.

The second conductive layer may be formed on the gate insulation layer GI at step 1505. The second conductive layer may be generated by forming a conductive film on the gate insulation layer GI through a printing process, a sputtering process, a chemical vapor deposition process, a pulsed laser deposition (PLD) process, a vacuum deposition process, an atomic layer deposition process, or the like; and by performing patterning through an etching process using a mask. Herein, a fourth mask may be used.

Afterward, the passivation layer PAS may be formed so as to cover the second conductive layer, at step 1506. The color filter may be formed on the passivation layer PAS at step 1507. For the color filter, for example, a color filter in a first color may be formed in a pattern by using a first mask, a color filter in a second color may be formed in a pattern by using a second mask, and a color filter in a third color may be formed in a pattern by using a third mask. While the color filter is formed, the light absorption layer LA is formed together. In order to form the color filter and the light absorption layer LA, three masks corresponding to the respective colors, that is, a fifth to a seventh mask may be used.

Afterward, the overcoat layer OC is formed so as to cover the color filter and the light absorption layer LA, at step 1508. The overcoat layer OC may be exposed and developed on the passivation layer PAS by using a mask. The mask may include openings corresponding to the via holes VIA1 and VIA2. Herein, an eighth mask may be used.

The light-emitting element may be formed on the overcoat layer OC. Specifically, on the overcoat layer OC, the anode electrode AE is formed in a pattern by using a ninth mask that has an opening corresponding to the emission areas EAs, at step 1509. Afterward, the emission layer EML and the cathode electrode CE are formed to be wide on the overcoat layer OC so as to cover the whole area of the anode electrode AE, at step 1510.

In order to manufacture the display panel 50 having the bankless structure described above, generally nine masks may be used. In order to manufacture the display panel 50 provided with a bank, an additional mask is required to form the bank, and thus 10 mask processes using a total of 10 masks may be performed. However, in the case of the bankless structure such as this aspect, nine masks and nine mask processes are required to manufacture the display panel 50, whereby the process is simplified and the manufacturing cost is reduced.

It will be understood by those skilled in the art that the present disclosure can be embodied in other specific forms without changing the technical idea or essential characteristics of the present disclosure. Therefore, it should be understood that the aspects described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A display device comprising:
a substrate in which a pixel is placed and including an emission area and a wire area adjacent to the emission area;
at least one wire disposed on the substrate in the wire area;
multiple insulation layers disposed on the at least one wire;
an anode electrode disposed on the multiple insulation layers in the emission area;
an emission layer disposed on the anode electrode and directly covering an entirety of the anode electrode; and
a cathode electrode disposed on the emission layer,
wherein the at least one wire disposed on the substrate applies a signal to the pixel and is covered by the multiple insulation layers,
wherein the anode electrode, the emission layer and the cathode electrode are overlapped with one another in the emission area, and
wherein at least one of the multiple insulation layers is disposed on the substrate except an edge area of the emission area or an entire area of the emission area.

2. The display device of claim 1, wherein the multiple insulation layers include:
a buffer layer covering the at least one wire;
a passivation layer disposed on the buffer layer; and
an overcoat layer disposed above the buffer layer.

3. The display device of claim 2, wherein the buffer layer is disposed on the substrate except the edge area of the emission area, and
wherein the passivation layer and the overcoat layer are disposed throughout the emission area and the wire area.

4. The display device of claim 3, wherein the buffer layer is disposed in a central area of the emission area and in the wire area.

5. The display device of claim 3, wherein the overcoat layer has a shape in which an upper surface of the overcoat layer is disposed in a region where the buffer layer is formed and the upper surface of the overcoat layer is disposed in the edge area of the emission area or the entire area of the emission area where the buffer layer is not formed.

6. The display device of claim 5, wherein the upper surface of the overcoat layer disposed in a region where the buffer layer is formed is located higher than the upper surface of the overcoat layer disposed in the edge area of the emission area or the entire area of the emission area where the buffer layer is not formed.

7. The display device of claim 6, wherein the anode electrode has a shape that matches a profile of the upper surface of the overcoat layer.

8. The display device of claim 4, wherein the anode electrode has a convex shape when the buffer layer is disposed in the central area of the emission area and in the wire area except the edge area of the emission area.

9. The display device of claim 3, wherein the anode electrode has a concave shape when the buffer layer is formed in the wire area except the entire area of the emission area.

10. The display device of claim 3, further comprising a color filter disposed between the passivation layer and the overcoat layer in the emission area.

11. The display device of claim 3, wherein the substrate further includes a non-emission area in which circuit elements for driving the pixel are disposed.

12. The display device of claim 11, further comprising:
an active layer disposed on the buffer layer in the non-emission area;
a gate insulation layer disposed in a pattern on the active layer; and
a conductive layer disposed on the gate insulation layer.

13. The display device of claim 12, wherein the buffer layer is disposed in a pattern in the region of the substrate except the edge area or the entire area during a patterning process of the gate insulation layer.

14. The display device of claim 12, further comprising a light absorption layer including a colorant and disposed on the passivation layer in the non-emission area.

15. A display device comprising:
a substrate in which a pixel is placed and including an emission area and a wire area adjacent to the emission area;
at least one wire disposed on the substrate in the wire area;
multiple insulation layers disposed on the at least one wire;
an anode electrode disposed on the multiple insulation layers in the emission area;
an emission layer disposed on the anode electrode and directly covering an entirety of the anode electrode; and
a cathode electrode disposed on the emission layer,
wherein the at least one wire disposed on the substrate applies a signal to the pixel and is covered by the multiple insulation layers,
wherein at least one of the multiple insulation layers includes a buffer layer disposed on the substrate except the emission area,
wherein the anode electrode, the emission layer and the cathode electrode are overlapped with one another in the emission area, and
wherein the multiple insulation layers includes the buffer layer covering the at least one wire, an active layer on the buffer layer in the emission area, a gate insulation layer in a pattern on the active layer, a conductive layer on the gate insulation layer, an overcoat layer above the substrate; and
wherein the buffer layer is etched in an edge area of the emission area or an entire area of the emission area by the forming of the gate insulation layer.

16. The display device of claim 15, wherein the buffer layer is disposed in a central area of the emission area and in the wire area.

17. The display device of claim 15, wherein the overcoat layer has a shape in which an upper surface of the overcoat layer is disposed in a region where the buffer layer is formed and the upper surface of the overcoat layer is disposed in the edge area or the entire area of the emission area where the buffer layer is not formed,
wherein the upper surface of the overcoat layer disposed in the region where the buffer layer is formed is higher than the upper surface of the overcoat layer disposed in the edge area or the entire area of the emission area where the buffer layer is not formed, and
wherein the anode electrode has a shape that matches a profile of the upper surface of the overcoat layer.

18. The display device of claim 15, further comprising,
a passivation layer on the substrate; and
a color filter on the passivation layer in the emission area.

* * * * *